(12) United States Patent
Gordon et al.

(10) Patent No.: US 7,932,176 B2
(45) Date of Patent: Apr. 26, 2011

(54) SELF-ALIGNED BARRIER LAYERS FOR INTERCONNECTS

(75) Inventors: Roy Gerald Gordon, Cambridge, MA (US); Hoon Kim, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 126 days.

(21) Appl. No.: 12/408,473

(22) Filed: Mar. 20, 2009

(65) Prior Publication Data
US 2009/0263965 A1 Oct. 22, 2009

Related U.S. Application Data

(60) Provisional application No. 61/038,657, filed on Mar. 21, 2008, provisional application No. 61/043,236, filed on Apr. 8, 2008, provisional application No. 61/074,467, filed on Jun. 20, 2008.

(51) Int. Cl.
*H01L 21/4763* (2006.01)
(52) U.S. Cl. ............... 438/627; 438/618; 257/E21.495; 257/E21.485
(58) Field of Classification Search .............. 438/627, 438/622, 687, 618, 643; 257/E21.495, E21.585, 257/E21.627, E21.597, E21.171, E21.584, 257/E21.476
See application file for complete search history.

(56) References Cited

U.S. PATENT DOCUMENTS

| | | | |
|---|---|---|---|
| 6,413,815 B1* | 7/2002 | Lai et al. | 438/243 |
| 7,304,384 B2 | 12/2007 | Koike et al. | |
| 7,507,666 B2* | 3/2009 | Nakao et al. | 438/687 |
| 7,755,191 B2* | 7/2010 | Furuya | 257/751 |
| 2007/0184651 A1* | 8/2007 | Cunningham | 438/637 |
| 2008/0057704 A1 | 3/2008 | Koike et al. | |
| 2008/0254232 A1* | 10/2008 | Gordon et al. | 427/585 |
| 2008/0280151 A1* | 11/2008 | Jourdan et al. | 428/450 |
| 2008/0286960 A1* | 11/2008 | Shimizu et al. | 438/622 |
| 2009/0035936 A1* | 2/2009 | Boemmels et al. | 438/652 |
| 2009/0096102 A1* | 4/2009 | Gambino et al. | 257/751 |
| 2009/0117731 A1* | 5/2009 | Yu et al. | 438/627 |
| 2009/0209099 A1* | 8/2009 | Yu et al. | 438/653 |
| 2009/0263965 A1* | 10/2009 | Gordon et al. | 438/643 |
| 2010/0188765 A1* | 7/2010 | Matsumoto et al. | 359/891 |

FOREIGN PATENT DOCUMENTS

WO WO-2004/046417 6/2004

(Continued)

OTHER PUBLICATIONS

Hausmann, et al., "Rapid Vapor Deposition of Highly Conformal Silica Nanolaminates," Science, vol. 298, Oct. 2002, pp. 402-406.

(Continued)

*Primary Examiner* — Walter L Lindsay, Jr.
(74) *Attorney, Agent, or Firm* — Wilmer Cutler Pickering Hale and Dorr LLP

(57) ABSTRACT

An interconnect structure for integrated circuits incorporates manganese silicate and manganese silicon nitride layers that completely surrounds copper wires in integrated circuits and methods for making the same are provided. The manganese silicate forms a barrier against copper diffusing out of the wires, thereby protecting the insulator from premature breakdown, and protecting transistors from degradation by copper. The manganese silicate and manganese silicon nitride also promote strong adhesion between copper and insulators, thus preserving the mechanical integrity of the devices during manufacture and use. The strong adhesion at the copper-manganese silicate and manganese silicon nitride interfaces also protect against failure by electromigration of the copper during use of the devices. The manganese-containing sheath also protects the copper from corrosion by oxygen or water from its surroundings.

60 Claims, 15 Drawing Sheets

FOREIGN PATENT DOCUMENTS

| | | |
|---|---|---|
| WO | WO-2007/119866 | 10/2007 |
| WO | WO-2007/142329 | 12/2007 |
| WO | WO-2009/117670 | 9/2009 |

OTHER PUBLICATIONS

Kim, et al., "Ultrathin CVD Cu Seed Layer Formation Using Copper Oxynitride Deposition and Room Temperature Remote Hydrogen Plasma Reduction," Journal of The Electrochemical Society, 155 (7), pp. H496-H503, 2008.

Li et al., "DO1: 10.1002/cvde.200606485, Full Paper: Thin, Continuous, and Conformal Copper Films by Reduction of Atomic Layer Deposited Copper Nitride**," Chemical Vapor Deposition, 2006, 12, pp. 435-441.

Li, et al., "Atomic Layer Deposition of Ultrathin Copper Metal Films from a Liquid Copper(I) Amidinate Precursor," Journal of The Electrochemical Society, 153 (11), pp. C787-C794, 2006.

* cited by examiner

FIG. 14
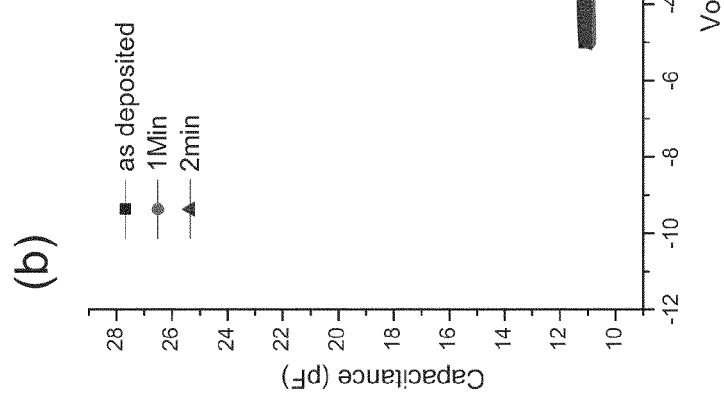
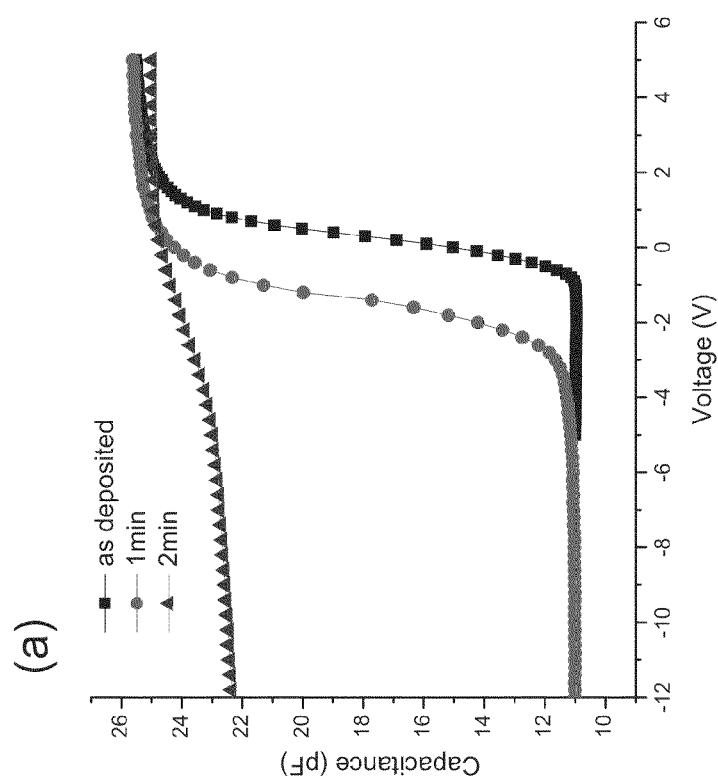

SELF-ALIGNED BARRIER LAYERS FOR INTERCONNECTS

RELATED APPLICATIONS

This patent disclosure claims the benefit of U.S. Patent Application No. 61/038,657, filed on Mar. 21, 2008, U.S. Patent Application No. 61/043,236, filed on Apr. 8, 2008, and U.S. Patent Application No. 61/074,467, filed on Jun. 20, 2008, the contents of which are hereby incorporated by reference herein in their entireties.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

INCORPORATION BY REFERENCE

All patents, patent applications and publications cited herein are hereby incorporated by reference in their entirety in order to more fully describe the state of the art as known to those skilled therein as of the date of the invention described herein.

BACKGROUND

Copper (Cu) is replacing aluminum as the material of choice for wiring of microelectronic devices, such as microprocessors and memories. However, the presence of copper in semiconductors such as silicon causes defects that can prevent the proper functioning of transistors formed in the semiconductor. Copper also increases the leakage of current through insulators, such as silicon dioxide, placed between the copper wires. Therefore use of copper wiring demands that efficient diffusion barriers surround the copper wires, to keep the copper confined to its proper locations.

Copper also has a tendency to move in the direction that electrons are flowing in a circuit. This electromigration process can lead to increased electrical resistance, or even an open circuit if a sufficiently large void forms within a copper interconnection. Most of this unwanted motion takes place along the surface of the copper. Therefore it is critical to maintaining long lifetimes that the copper interconnections be surrounded by materials that inhibit electromigration. Tantalum metal (Ta) serves this function on the bottom and sides of currently-used copper interconnections. The top of copper wiring (those parts that do not connect to an upper level by a via) are covered by SiC or $Si_3N_4$, although these materials are not as effective as the Ta in preserving the copper against electromigration. The SiC or $Si_3N_4$ also have the disadvantage that they have a higher dielectric constant than the rest of the insulator, so they increase the capacitance of the circuits and decrease the speed with which signals can be transmitted through the wiring.

Improved lifetime against electromigration has been achieved by electroless deposition of cobalt-tungsten alloys containing phosphorous (CoWP) or boron (CoWB) selectively on top of the copper wires. This selective process is supposed to avoid any deposition of these electrically conductive alloys on the surface of the insulator. Thus it should lead to a self-aligned conductive diffusion barrier on top of all surfaces of the copper that were exposed by the CMP step. However, breakdown of the selectivity causes some electrical shorts over the insulators between Cu wires, making this process unreliable for mass production. Another disadvantage of this self-aligned process is that the alloy barrier remains on the parts of the Cu that will be later contacted by Cu-filled vias. In these areas, the CoWP or CoWB alloy becomes part of the electrical circuits, and increases their electrical resistance over the lower value they would have had without the alloy layer between the via and the Cu in the layer below.

Direct, low-resistance contact between copper vias and the copper below has been demonstrated by the use of sputtered Cu—Mn alloy seed layers followed by electroplating and then thermal annealing to form self-aligned $MnSi_xO_y$ diffusion barrier layers at the interface between the Cu—Mn alloy and the insulator. The thermal anneal is supposed to remove Mn from the Cu—Mn layer so that the remaining purer Cu has low resistance. The Mn diffuses either to form the $MnSi_xO_y$ layer on the insulator or it diffuses to the top, free surface of the Cu where it forms a $MnO_x$ layer (probably x=2) by reaction with oxygen in the anneal atmosphere. This $MnO_x$ layer is then removed along with the rest of the excess Cu during CMP. A disadvantage of this process is that Mn impurity is present in the Cu during the anneal that is supposed to increase the grain size and thereby decrease the electrical resistance of the Cu. The presence of the Mn impurity during the anneal can restrict the grain growth and thereby increase the final resistance of the Cu over what it would have been without the presence of the Mn impurity. Another disadvantage of this process is that some Mn impurity may remain in the Cu even after the anneal, thereby increasing its electrical resistance over that of pure Cu.

It has also been proposed to diffuse Mn to the upper surface of a copper interconnect in an oxygen-containing atmosphere in order to form an $MnO_x$ layer that could act as a diffusion barrier. However, such a $MnO_x$ layer has very weak adhesion to copper, and therefore the electromigration lifetime of such a structure is undesirably short.

It has further been proposed to use CVD or ALD with a manganese-containing metal-organic precursor and an oxygen-containing gas to form a manganese oxide barrier layer for copper. However, such a manganese oxide barrier layer forms on the surface of the insulator, rather than diffusing into the insulator. Thus the MnO barrier takes up space that otherwise could be occupied by conductive copper metal, and thus the resistance of a copper wire is undesirably increased. Also, the adhesion of copper to such a manganese oxide barrier may be less than desired for mechanical stability and long lifetime against electromigration.

SUMMARY

This technology relates to copper interconnections used in microelectronics, and more particularly relates to materials and techniques to secure robust adhesion between the copper and the surrounding materials, providing barriers to prevent diffusion of copper out of the wiring, keeping oxygen and water from diffusing into the copper, and keeping the copper wires from being damaged by the electric current that they carry.

A process is described for forming a self-aligned diffusion barrier in microelectronic devices without the disadvantage of having a metallic impurity present in the Cu during or after the anneal. In one embodiment a metal such as Mn, Cr or V is reacted with the surfaces of the insulator inside the vias and trenches prior to deposition of a Cu-containing seed layer. Preferably, the Mn, Cr or V is delivered to the surfaces by a conformal chemical vapor deposition (CVD) process that does not involve the use any oxygen-containing co-reactant along with the precursor for Mn, Cr or V. Thus, this process does not increase via resistance by metal oxide formation at the bottoms of the vias. Following the metal reaction, a Cu seed layer is deposited, preferably by CVD. The seed layer can also be deposited as a copper compound, such as copper oxide ($Cu_2O$), copper nitride ($Cu_3N$) or copper oxynitride ($CuO_zN_w$), which is later reduced to Cu.

In another aspect of the invention, Mn, Cr or V is deposited on the planar surface of a partially completed interconnect just after a CMP step. On the top of the insulating portions of the surface, the Mn, Cr or V reacts with silicon and oxygen contained in the insulator to form an insulating metal silicate layer, e.g., a $MnSi_xO_y$ layer where the metal is Mn. In the region where the metal Mn is deposited on the tops of the Cu lines (the tops of the trenches filled with Cu), the Mn dissolves into the top layers of the Cu to form a Cu—Mn alloy. Then a blanket deposition of the insulator for the next higher level of insulator is formed over both the Cu—Mn and $MnSi_xO_y$ regions. During the deposition and/or during later anneals, the Mn in the Cu—Mn surface layer diffuses upward to react with the insulator to form a $MnSi_xN_y$ diffusion barrier between the Cu and the insulator, in the embodiment in which the initially-deposited part of this insulator is $Si_3N_4$. The presence of this $MnSi_xN_y$ layer also increases the adhesion between the Cu and the insulator above it.

The combination of both of these aspects results in strongly adherent diffusion barrier and adhesion layers that surround the Cu on all of its surfaces. These $MnSi_xO_y$ and $MnSi_xN_y$ layers provide highly conductive, strongly adherent and durable copper layers for, e.g., the production of electronic elements, circuits, devices, and systems.

In certain embodiments, the present application describes a process for forming an integrated circuit interconnect structure. The process comprises: providing a partially-completed interconnect structure that includes an electrically insulating region and an electrically conductive copper-containing region, the partially-completed interconnect structure having a substantially planar surface; depositing a metal (M) selected from the group consisting of manganese, chromium and vanadium on or into at least a portion of the electrically conductive copper-containing regions; depositing an insulating film on at least a part of the deposited metal, wherein the region of the deposited insulating film in contact with said at least a part of the deposited metal is substantially free of oxygen; and reacting at least a part of the deposited metal with the insulating film to form a barrier layer, wherein the electrically conductive copper-containing region is substantially free of elemental metal (M).

In other embodiments, the process includes: providing a partially-completed interconnect structure having a via or a trench, the via or trench including sidewalls defined by one or more electrically insulating materials and an electrically conductive copper-containing bottom region; depositing a metal (M) selected from the group consisting of manganese, chromium and vanadium on the partially-completed interconnect structure; forming second insulating sidewall regions through reaction of the deposited metal and said one or more electrically insulating materials; removing or diffusing away the metal from the bottom region to expose the electrically conductive copper-containing bottom region; and filling the via or trench with copper.

In other embodiments, the manganese may be replaced by chromium or vanadium.

Other features and advantages of the invention will be apparent from the following description and accompanying figures, and from the claims.

BRIEF DESCRIPTION OF THE DRAWINGS

FIG. 14 shows capacitance-voltage curves for samples of (a) $Cu/SiO_2/Si$ and (b) $Cu/MnSi_xO_y/SiO_2/Si$ before and after annealing at 250° C. under a 1 MV/cm electric field.

DETAILED DESCRIPTION OF THE INVENTION

Figure 1:
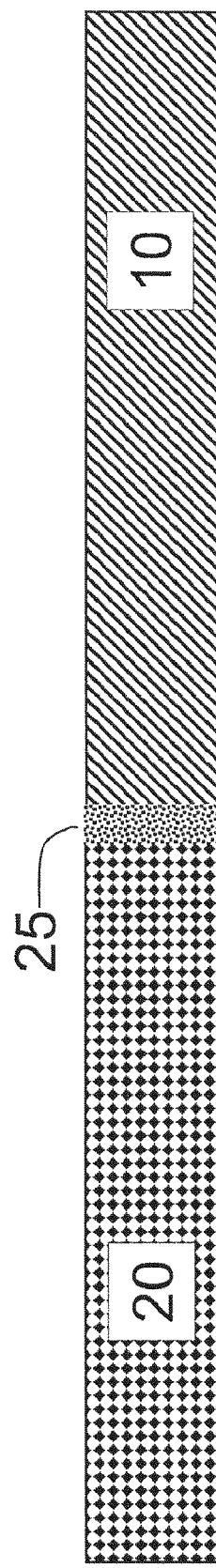
FIG. 1 is a schematic cross section of the top of a partially completed interconnect wiring structure in accordance with the invention, after a Chemical Mechanical Polishing (CMP) step.

A partially completed multi-level wiring structure for a microelectronic device is shown in FIG. 1. This structure comprises a substantially planar surface comprising insulating areas 10, e.g., silica, and electrically conducting areas 20, e.g., copper, forming the top of a completed lower level of wiring, separated by a diffusion barrier 25. In some embodiments, this diffusion barrier can comprise manganese silicate. Typically, the device at this stage has been processed by CMP followed by cleaning.

Figure 2:
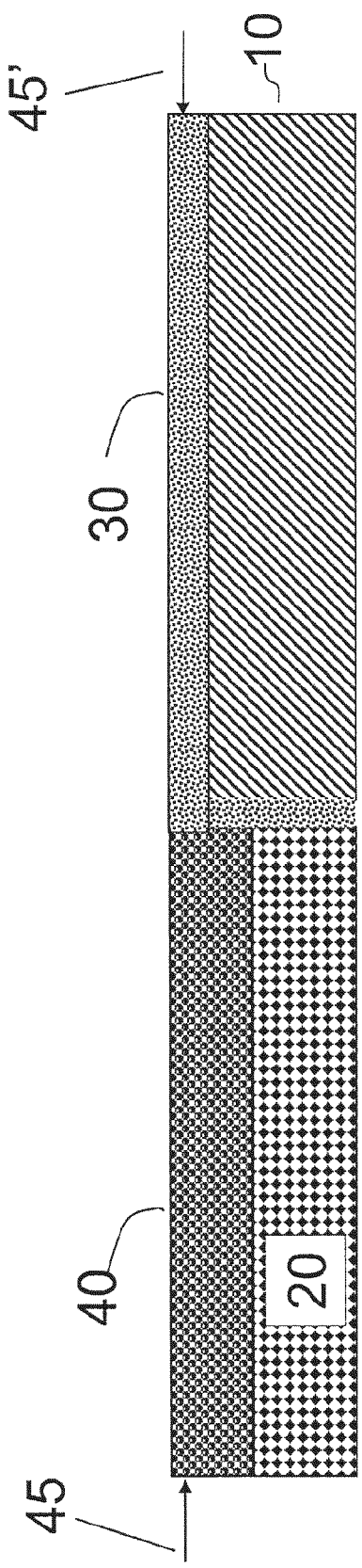
FIG. 2 is the structure of FIG. 1 after a metal deposition.

Next Mn metal is deposited on the surface. The Mn reacts with the exposed areas of the insulator 10 to form an insulating $MnSi_xO_y$ layer marked 30 in FIG. 2. In the exposed Cu areas of the surface 20, the Mn diffuses into the upper portion of the Cu to form a CuMn alloy 40. The location of the upper surface prior to deposition is indicated by arrows 45, 45'. Typically, Mn is deposited on a heated substrate. If the temperature of the substrate is high enough (typically over 150° C.) and the deposition of Mn is slow enough, then the reaction and diffusion of the Mn may be complete by the end of the deposition. If the reaction with the insulator and the diffusion into the Cu are not complete during deposition, then a post-deposition anneal may be used to complete the reaction and diffusion.

Mn may be deposited by any convenient method, including chemical and physical methods. Chemical methods include chemical vapor deposition (CVD) and atomic layer deposition (ALD). Physical methods include sputtering and evaporation. Because the substrate is planar, step coverage by the deposition method is not critical to this step. Thus physical methods, which have poor step coverage, are adequate for this deposition step. CVD can also be used in this step whether or not the specific CVD process has good step coverage.

Figure 3:
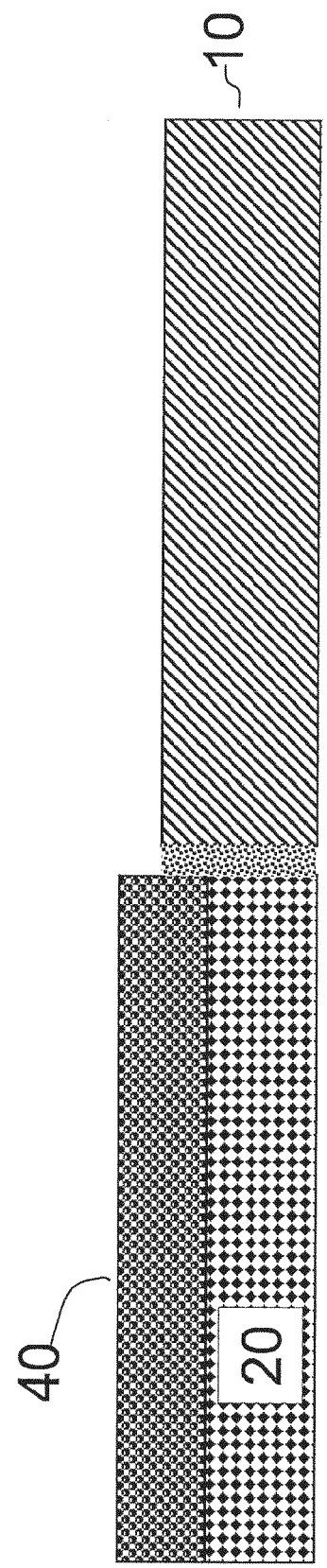
FIG. 3 is the structure of FIG. 2 after removal of metal silicate.

The $MnSi_xO_y$ layer 30 can optionally be removed after Mn deposition, as is shown in FIG. 3. The $MnSi_xO_y$ layer 30 formed in the last step is an electrical insulator, but its leakage current may be higher than desired in some applications. In such cases, this metal silicate layer 30 may be removed, in order to reduce the leakage current in devices. The silicate layer 30 may be removed by any convenient means, such as polishing, wet etching or dry etching. The removal may be non-selective, removing copper at the same rate as the silicate, thereby maintaining a flat surface. Alternatively, the silicate layer 30 may be removed selectively without removing copper, as is illustrated in FIG. 3. The resulting uneven surface requires a conformal method to deposit the blanket insulator in the next step.

Figure 4:
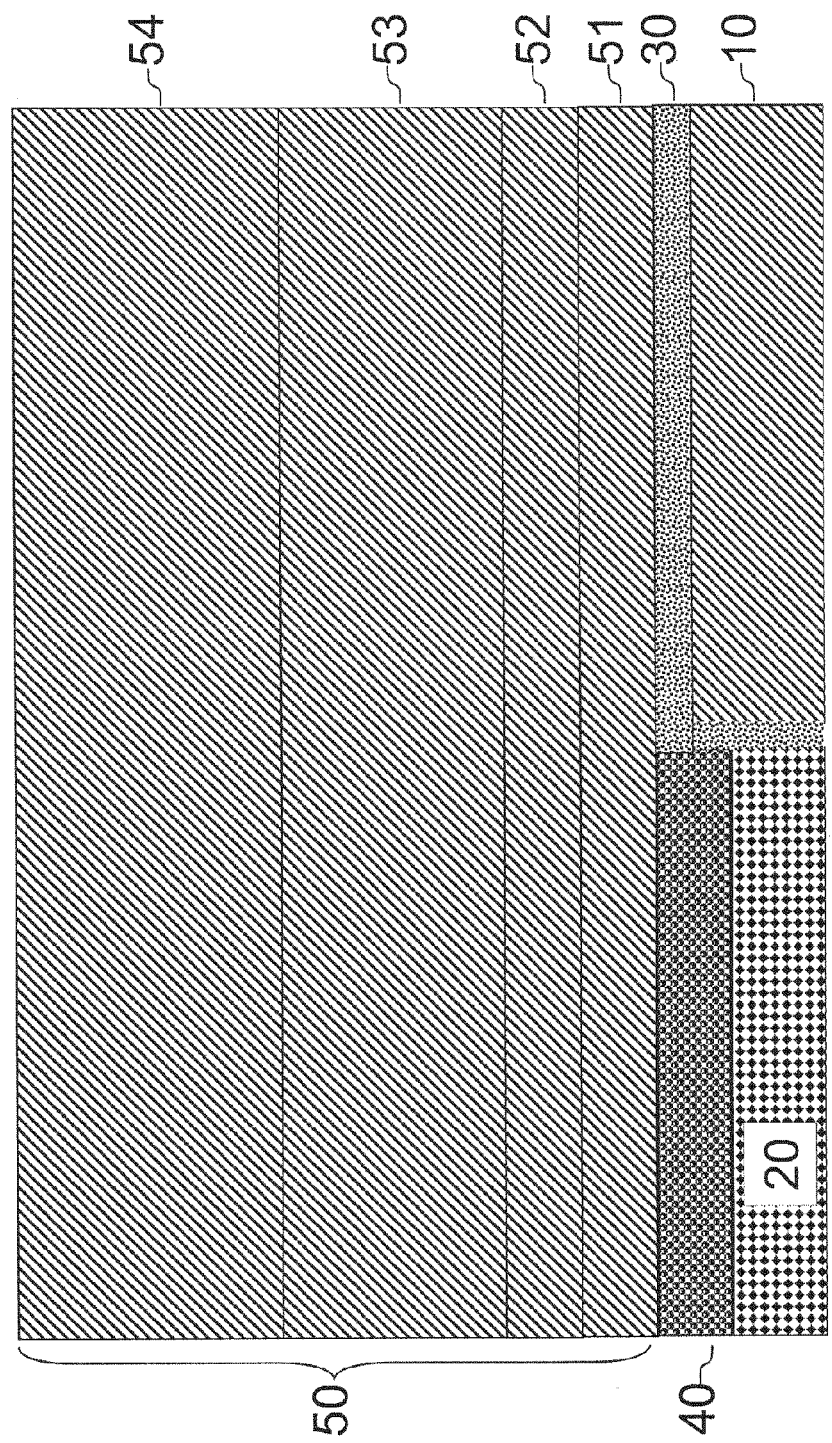
FIG. 4 is the structure of FIG. 3 after a blanket insulator is deposited.

A blanket insulator layer 50 is next deposited on this structure, as shown in FIG. 4. Note that the structure in FIG. 4 includes the silicate layer 30 above insulating layer 10. Any of the methods known in the art may be used to make this insulator layer, including plasma-enhanced CVD or spin coating. Insulator compositions comprising Si and O may be used. In certain embodiments, insulator compositions comprising Si but which is substantially free of O, such as SiN, SiC, SiCN, and the like, may be used. In certain embodiments, insulator layers can be built up by deposition of several sub-layers of insulating material, each adding a specific functionality to the overall insulating layer. For example, a first insulating sub-layer 51 which enhances adhesion to the manganese-doped copper layer underneath it, such as a $Si_3N_4$, may be used. In certain embodiments, sub-layer 51 may be substantially free of oxygen. In certain embodiments, sub-layer 51 that is substantially free of oxygen may enhance adhesion to the manganese-doped copper layer over than that obtained by adhesion of a sub-layer 51 which comprises oxygen. Next an etch-stop sub-layer 52, such as silicon carbide, may be deposited on top of sub-layer 51. The etch-stop sub-layer 52 can help to define the proper depth for etching of the holes (vias). In certain embodiments, the next insulating sub-layer 53 may be a porous dielectric with a very low dielectric constant (typically k less than about 2.5). The final insulating sub-layer 54 may be a denser non-porous dielectric with a higher dielectric constant (k greater than about 2.5), which can help to protect the more fragile porous dielectric layer from mechanical damage, as well as keeping water from entering into the pores of the porous dielectric. In certain embodiments, sub-layers 53 and 54 may contain Si and O. Another function of the sub-layer 53 may be as an etch-stop layer for defining the bottoms of trenches through the sub-layer 54. As would be readily apparent to one of ordinary skill in the art, numerous variations for the specific insulator layer 50 (such as thickness, layer combinations, material compositions, etc.) are within the scope of the present invention. For simplicity, any reference to insulating layer 50 in the present application should be understood to encompass one or more of the sub-layers described herein.

Figure 5:
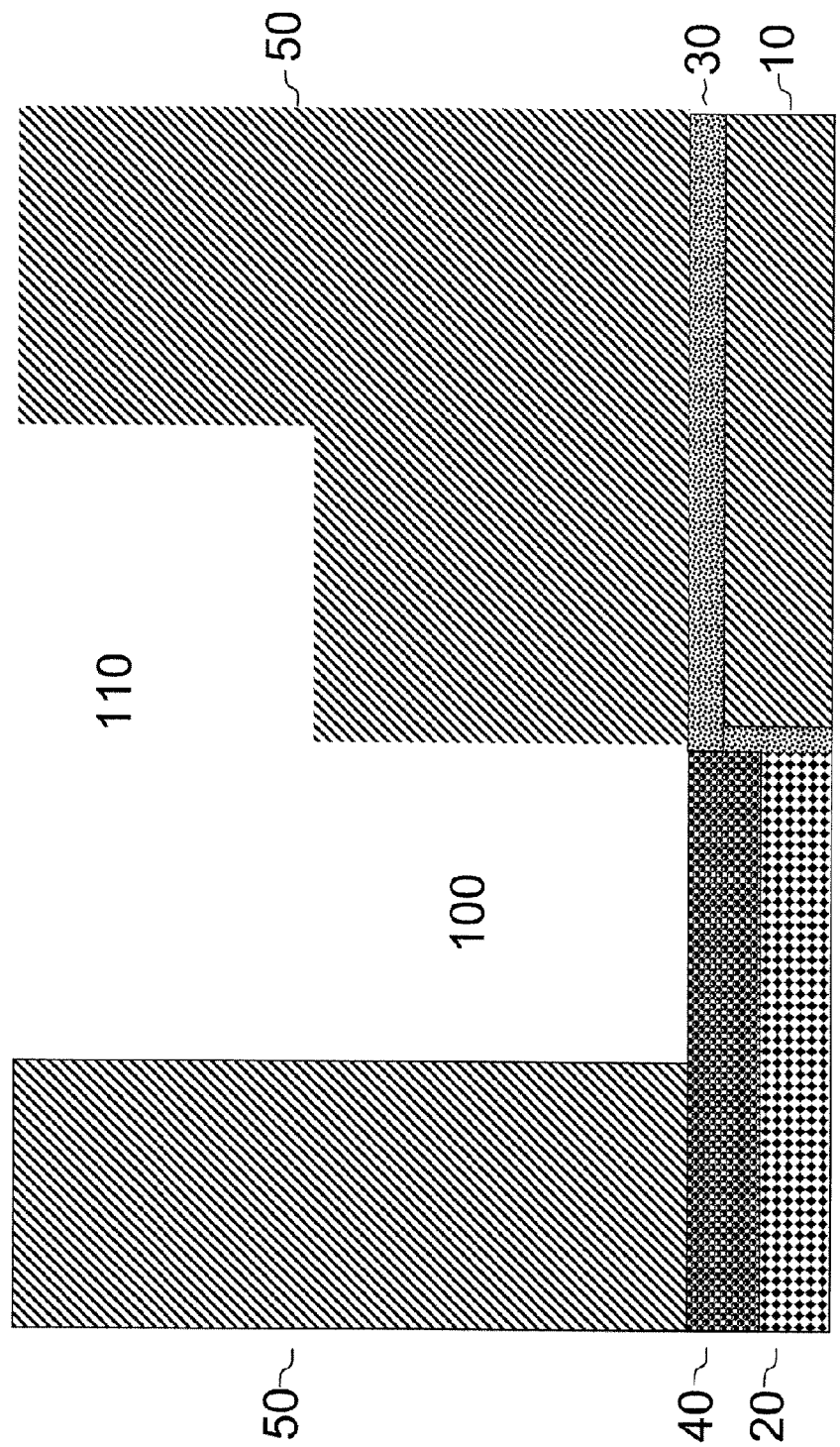
FIG. 5 is the structure of FIG. 4 after lithography and etching of vias and trenches in the insulator.

Lithography and etching are used to pattern holes (vias) 100 and trenches 110 into the insulator layer 50. A schematic cross section of the resulting structure is shown in FIG. 5.

Figure 6:
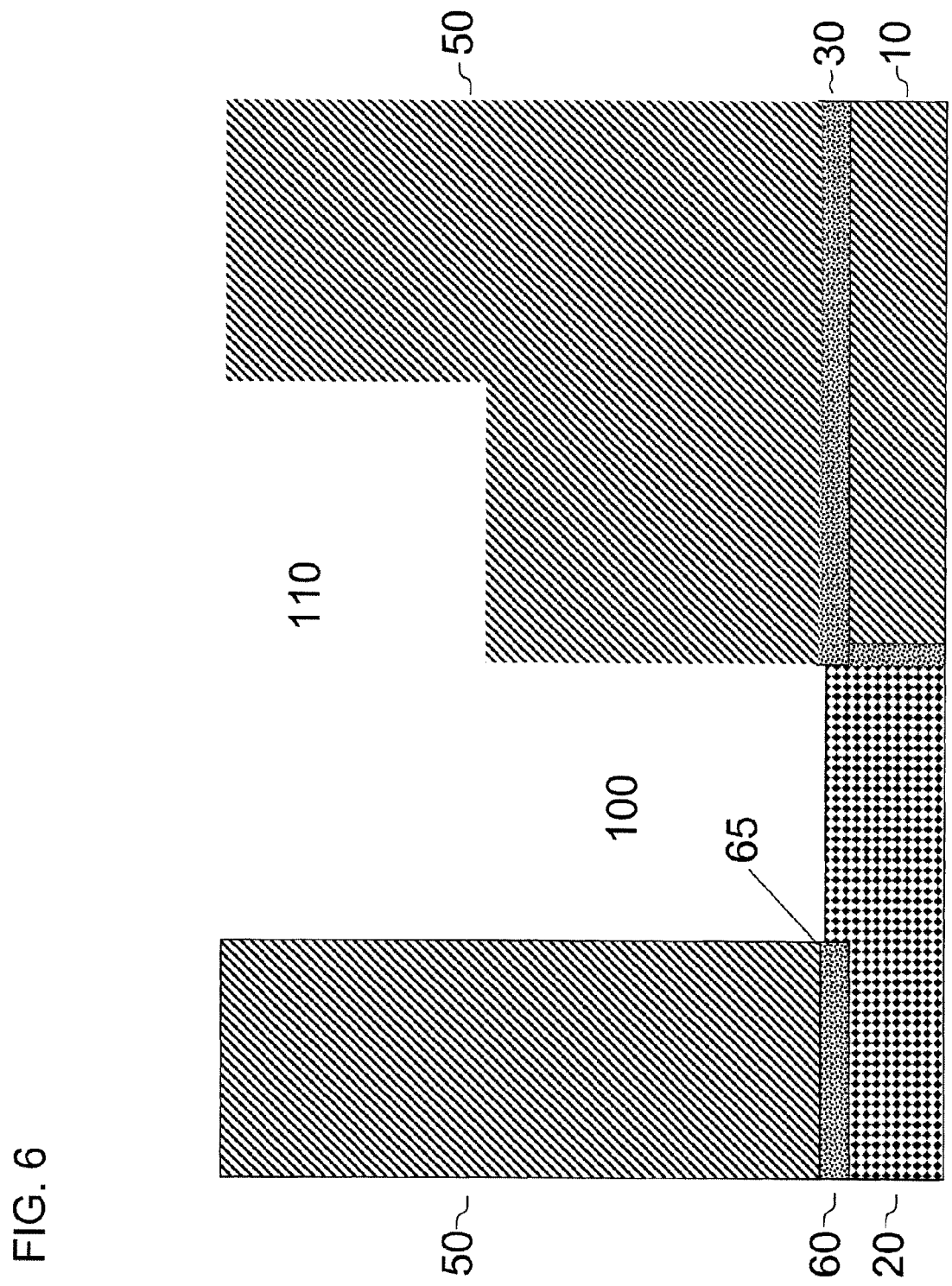
FIG. 6 is the structure of FIG. 5 after an anneal.

This structure is annealed to form a $MnSi_xN_y$ layer 60 (assuming the use of $Si_3N_4$ as sub-layer 51) at the interface between the insulating silica layer 50 and the CuMn alloy layer 40, as shown in FIG. 6. The $MnSi_xN_y$ layer 60 serves as a barrier against diffusion of Cu out of the layer 20 and also provides strong adhesion between the Cu 20 and the insulator 50. The $MnSi_xN_y$ can also serve to prevent diffusion of oxygen or water from the insulator layer 50 into the Cu layer 20. After anneal, most of the Mn from the Mn—Cu alloy layer 40 is located in the $MnSi_xN_y$ layer 60; however, some Mn may migrate during anneal to the upper surface of the layer 20 to form a manganese oxide layer (not shown). Any manganese oxide remaining on the Cu surface may be removed by directional sputtering, or by selective etching by a vapor such as formic acid or by a liquid acid solution. This is indicated by the slight recession 65 between the upper surface of Cu layer 20 and adjacent $MnSi_xN_y$ layer 60.

Figure 7:
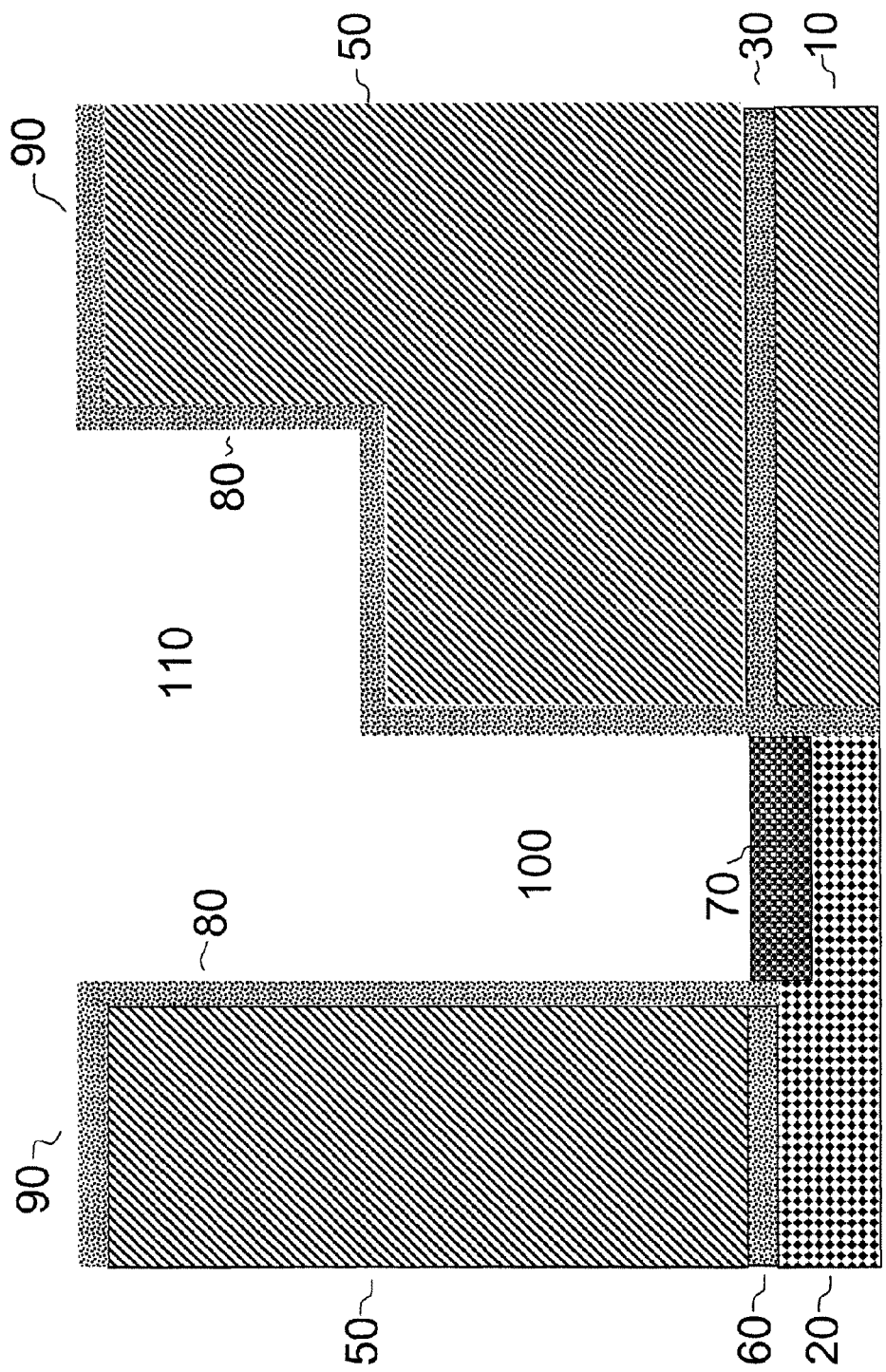
FIG. 7 is the structure of FIG. 6 after another metal deposition.
Figure 8:
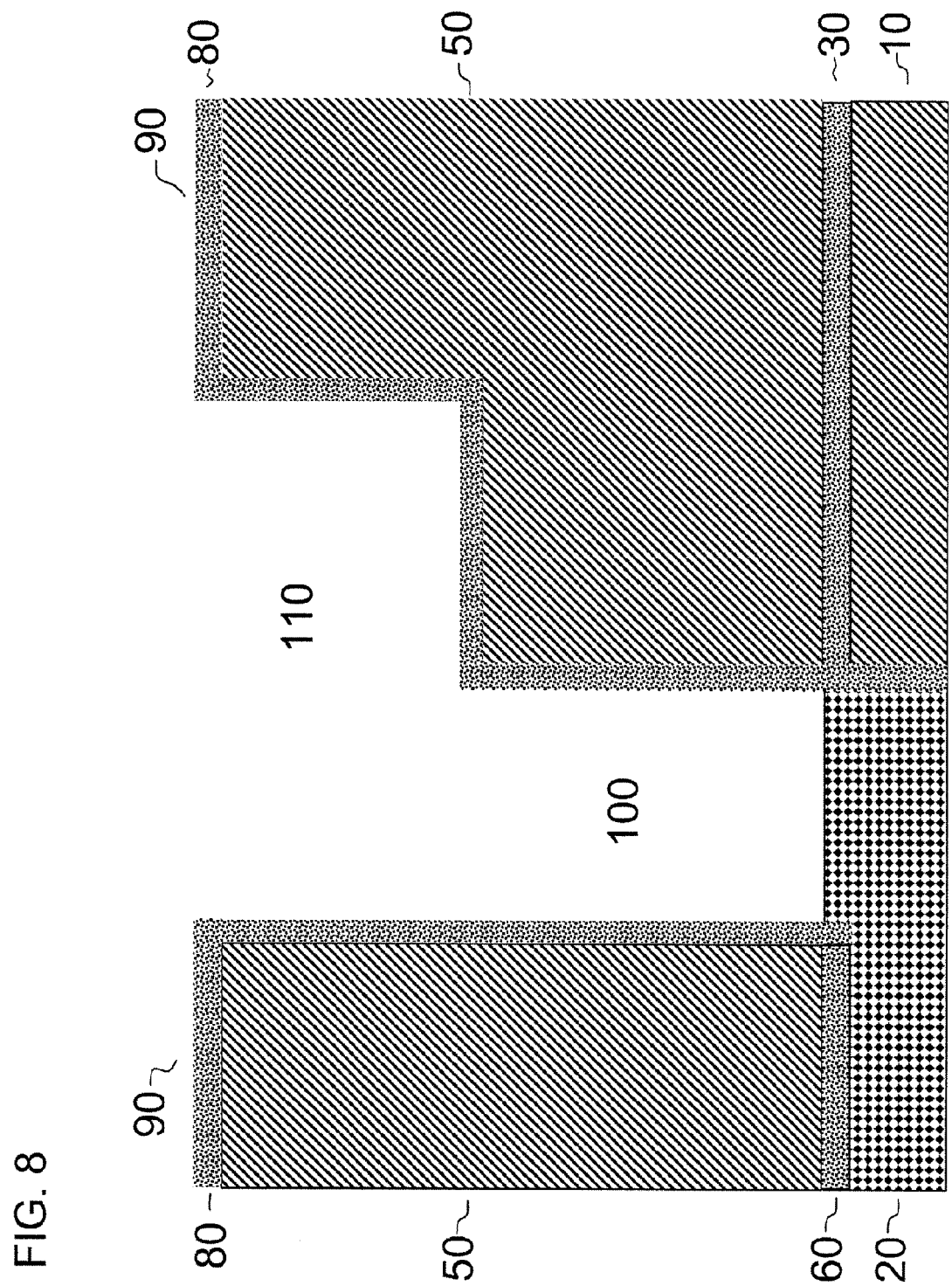
FIG. 8 is the structure of FIG. 7 after an anneal.

Another layer of Mn is deposited next, preferably by a conformal method such as CVD or ALD. This step forms a layer 80 on the walls of the vias and trenches, which can vary from $MnSi_xO_y$ near the top and $MnSi_xN_y$ near the bottom if using silica as sub-layer 54 and silicon nitride as sub-layer 51. This step can further form a top layer of $MnSi_xO_y$ 90 on the upper surface of insulator layer 50, as shown in FIG. 7. A CuMn alloy layer 70 forms initially on the exposed copper surface of layer 20, but then the Mn diffuses to form more of the insulator surfaces such as layer 60. If the formation of these layers is not complete by the end of the deposition, an additional anneal and possibly an acid etch is used to form the structure shown in FIG. 8, in which the copper 20 layer is substantially free of Mn impurity.

Figure 9:
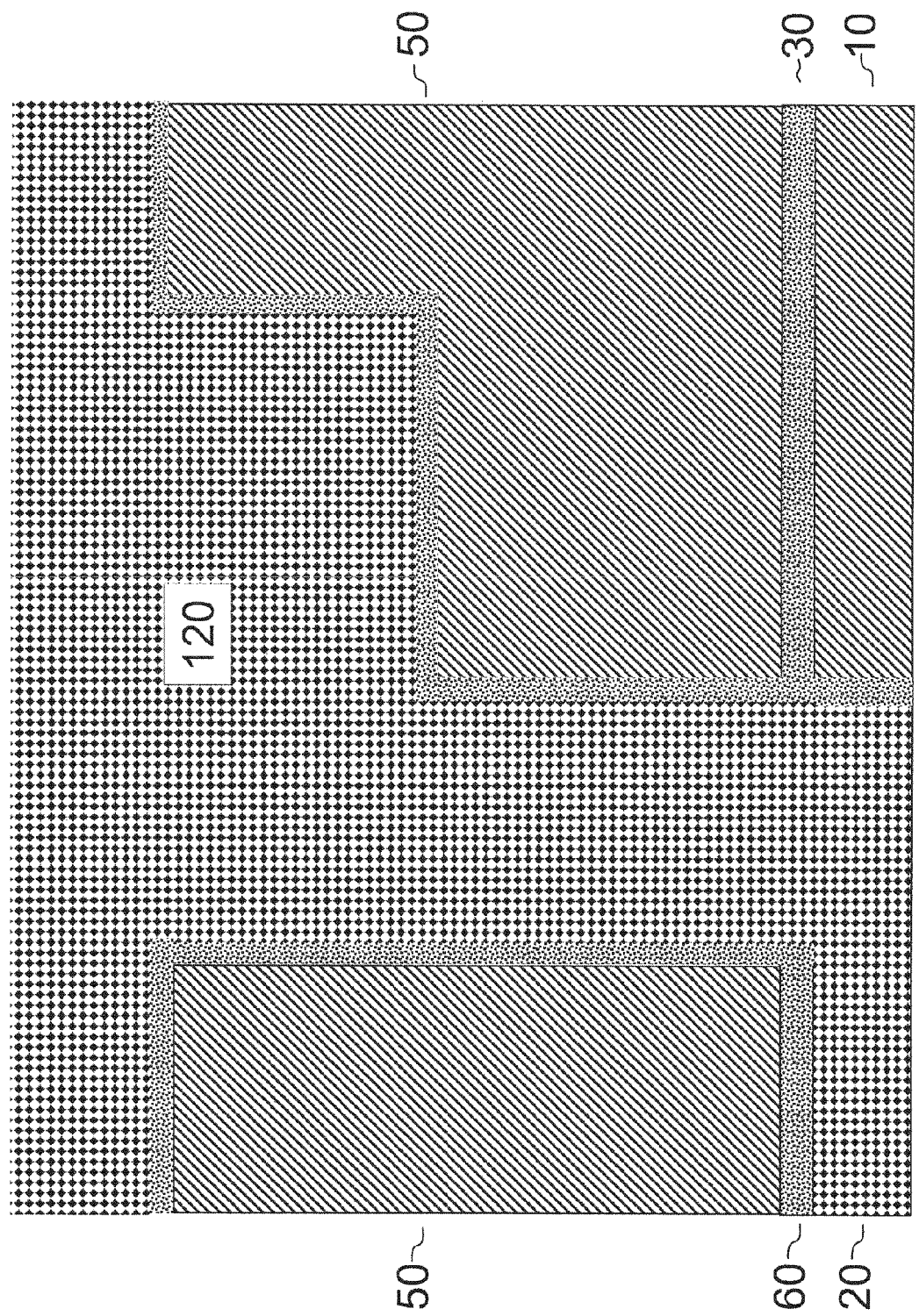
FIG. 9 is the structure of FIG. 8 after seed layer deposition and filling with copper.

Next, a seed layer of Cu is formed, preferably by a conformal method such as CVD, ALD or IPVD. Then the vias and trenches are filled by electroplating to form the structure shown in FIG. 9. This pure Cu layer 120 is annealed to increase the grain size and reduce the resistance.

Figure 10:
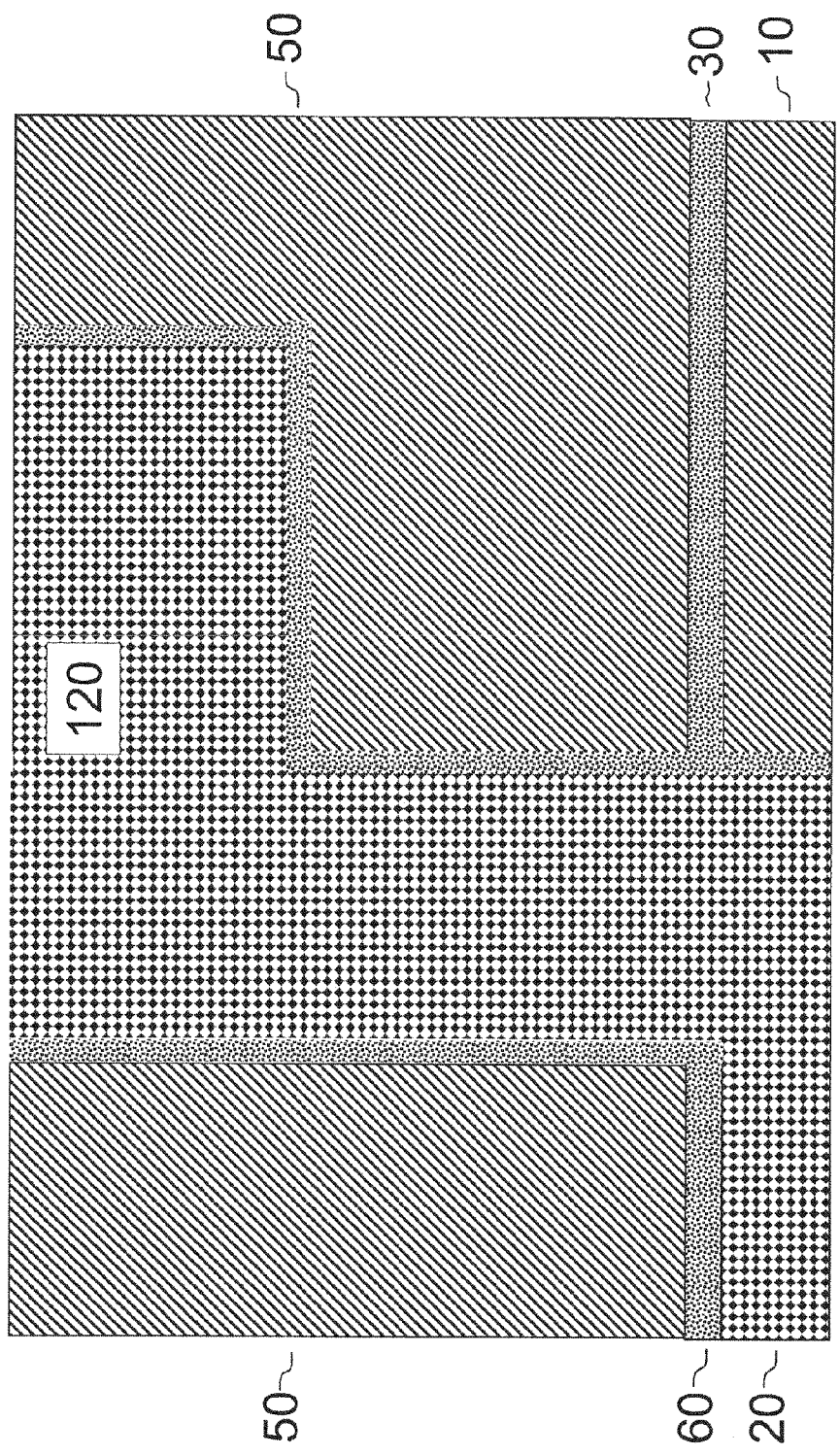
FIG. 10 is the structure of FIG. 9 after Chemical Mechanical Polishing.

Finally the excess copper is removed by CMP to create the structure shown in FIG. 10. This stage corresponds to the structure of FIG. 1, with one more stage of wiring completed.

In one or more embodiments, vapor deposition is used to deposit a metal M selected from the group of Mn, Cr and V. Metal amidinate compounds of the formula $M(AMD)_m]_n$ may be used as precursors, where AMD is an amidinate ligand and typically m=2 or 3 and m=1 or 2. For the case m=2 and n=1, these compounds may have the following structure:

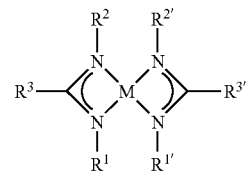

in which $R^1$, $R^2$, $R^3$, $R^{1'}$, $R^{2'}$ and $R^{3'}$ are groups made from one or more non-metal atoms, such as hydrogen, hydrocarbon groups, substituted hydrocarbon groups, and other groups of non-metallic atoms. In one CVD method for depositing Mn, a manganese amidinate vapor is brought into contact with a heated substrate. Where the substrate is Cu, a CuMn alloy is formed. Where the substrate contains silicon and oxygen, an insulating surface layer of $MnSi_xO_y$ is formed. In order for these layers to be formed, the temperature of the heated surface should be sufficiently high, typically over 150° C., or preferably over 300° C.

In one or more embodiments, the Mn-containing precursor can be a manganese amidinate having the formula, [Mn(AMD)$_m$]$_n$, where AMD is an amidinate and m=2 or 3 and n can range from 1 to 3. Some of these compounds for m=2, n=1 have a structure 1,

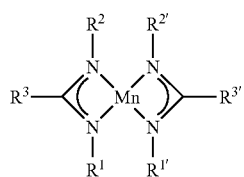

in which $R^1$, $R^2$, $R^3$, $R^{1'}$, $R^{2'}$ and $R^{3'}$ are groups made from one or more non-metal atoms, such as hydrogen, hydrocarbon groups, substituted hydrocarbon groups, and other groups of non-metallic atoms. In some embodiments, $R^1$, $R^2$, $R^3$, $R^{1'}$, $R^{2'}$ and $R^{3'}$ may be chosen independently from hydrogen, alkyl, aryl, alkenyl, alkynyl, trialkylsilyl, alkylamide or fluoroalkyl groups or other non-metal atoms or groups.

Exemplary hydrocarbon groups include $C_1$-$C_6$ alkyl, $C_2$-$C_6$ alkenyl and $C_2$-$C_6$ alkynyl groups. They can be branched or unbranched.

"Alkyl group" refers to a saturated hydrocarbon chain that may be a straight chain or branched chain or a cyclic hydrocarbon group, containing the indicated number of carbon atoms. For example, $C_1$-$C_6$ indicates that the group may have from 1 to 6 (inclusive) carbon atoms in it. Examples of alkyl groups include, but are not limited to, ethyl, propyl, isopropyl, butyl, and tert-butyl groups. Examples of cyclic alkyl groups include, but are not limited to, cyclopropyl, cyclopropylmethyl, cyclobutyl, cyclopentyl, cyclohexyl, cyclohexylmethyl, cyclohexylethyl, and cycloheptyl groups.

"$C_2$-$C_6$ alkenyl group" refers to a straight or branched chain unsaturated hydrocarbon containing 2-6 carbon atoms and at least one double bond. Examples of a $C_2$-$C_6$ alkenyl group include, but are not limited to, groups derived by removing a hydrogen from ethylene, propylene, 1-butylene, 2-butylene, isobutylene, sec-butylene, 1-pentene, 2-pentene, isopentene, 1-hexene, 2-hexene, 3-hexene, and isohexene.

"$C_2$-$C_6$ alkynyl group" refers to a straight or branched chain unsaturated hydrocarbon group containing 2-6 carbon atoms and at least one triple bond. Examples of a $C_2$-$C_6$ alkynyl group include, but are not limited to, groups derived by removing a hydrogen from acetylene, propyne, 1-butyne, 2-butyne, isobutyne, sec-butyne, 1-pentyne, 2-pentyne, isopentyne, 1-hexyne, 2-hexyne, and 3-hexyne.

"Substituted hydrocarbon group" refers to a saturated or unsaturated, straight or branched chain hydrocarbon containing 1-6 carbon atoms that can be further substituted with other functional groups, such as halogen or boron, or boron-containing groups.

"Halogen" refers to an atom of fluorine, chlorine, bromine, or iodine. Halogenated hydrocarbons include fluorinated, chlorinated or brominated alkyl. Exemplary fluorinated hydrocarbons include fluoroalkyl, fluoroalkenyl and fluoroalkynyl groups and combinations thereof.

"Groups of non-metallic atoms" include nitrogen-containing and silicon-containing groups. Exemplary nitrogen-containing R groups include amines (NR'R"), in which R' and R" include one or more of H, $C_1$-$C_6$ alkyl, $C_2$-$C_6$ alkenyl or $C_2$-$C_6$ alkynyl group and combinations thereof.

Exemplary silicon-containing R groups include silyl groups (SiR'R"R'''), in which R', R" and R''' include one or more of H, $C_1$-$C_6$ alkyl, $C_2$-$C_6$ alkenyl or $C_2$-$C_6$ alkynyl group and combinations thereof.

In some embodiments, $R^1$, $R^2$, $R^3$, $R^{1'}$, $R^{2'}$ and $R^{3'}$ are each independently alkyl or fluoroalkyl or silylalkyl groups or alkylamide groups. In some embodiments, the R" groups contain 1 to 4 carbon atoms. In other embodiments, the Mn precursor is an oligomer of structure 1, with n=2 or more. The manganese amidinate may comprise manganese(II) bis(N,N'-diisopropylpentylamidinate), corresponding to taking $R^1$, $R^2$, $R^{1'}$ and $R^{2'}$ as isopropyl groups, and $R^3$ and $R^{3'}$ as n-butyl groups in the general formula 1.

In a CVD method, bis(N,N'-diisopropylpentylamidinato)manganese(II) vapor is flowed over a surface that has been heated to a temperatures of 100 to 500° C., or more preferably 150 to 400° C. A CuMn alloy is formed on the exposed copper surfaces. A MnSi$_x$O$_y$ layer is formed as a diffusion barrier over the insulating areas. In some embodiments, the manganese content of the MnSi$_x$O$_y$ layer and the CuMn layer is equivalent to a manganese metal film with thickness of 1 to 10 nm, or more preferably a thickness of 2 to 5 nm. Alternatively, the vapor is mixed with dihydrogen gas (H$_2$) at a temperature above 90° C. and used for the CVD process.

Manganese amidinates may be made by any conventional method. See, e.g., WO 2004/046417, which is incorporated by reference in its entirety.

In one or more embodiments, the metal precursor may include cyclopentadienyl and carbonyl ligands, corresponding to the general formula (Cp)$_q$M$_r$(CO)$_s$ where Cp is an cyclopentadienyl radical substituted by up to five groups, and q, r, and s can be any positive integer. These compounds may have the following structure:

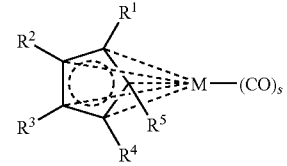

In one or more embodiments, the Mn-containing precursor can be a manganese cyclopentadienyl tricarbonyl having the formula, (Cp)Mn(CO)$_3$. Some of these compounds have a structure 2,

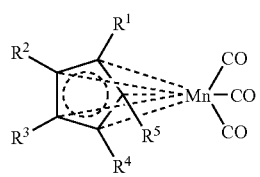

in which the $R^1$, $R^2$, $R^3$, $R^4$, and $R^5$ groups are made from one or more non-metal atoms, such as hydrogen, hydrocarbon groups, substituted hydrocarbon groups, and other groups of non-metallic atoms, as described herein above. In some embodiments, $R^1$, $R^2$, $R^3$, $R^4$, and $R^5$, may be chosen independently from hydrogen, alkyl, aryl, alkenyl, alkynyl, trialkylsilyl or fluoroalkyl groups or other non-metal atoms or groups. In some embodiments, $R^1$, $R^2$, $R^3$, $R^4$ and $R^5$ are each independently alkyl or fluoroalkyl or silylalkyl groups or alkylamide groups. In some embodiments, the R''' groups contain 1 to 4 carbon atoms. A preferred compound of this type is commercially available methylcyclopentadienylmanganese tricarbonyl, (MeCp)Mn(CO)$_3$, in which R$^1$ is a methyl group and the other R'''s are hydrogen.

In one or more embodiments, the metal precursor may include two Cp ligands, with formula M(Cp)$_2$ where Cp is a cyclopentadienyl radical substituted by up to five groups. The compounds may have the following structure:

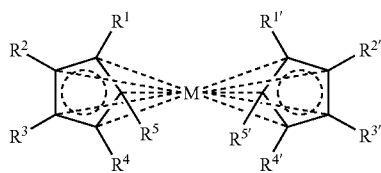

In one or more embodiments, the Mn-containing precursor can be a manganese cyclopentadienyl having the formula, Mn(Cp)$_2$. Some of these compounds have the formula 3,

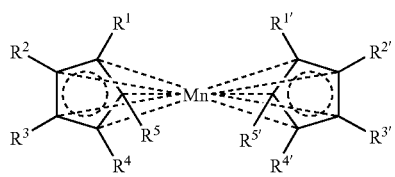

3 in which R$^1$, R$^2$, R$^3$, R$^4$, R$^5$, R$^{1'}$, R$^{2'}$, R$^{3'}$, R$^{4'}$ and R$^{5'}$ are groups made from one or more non-metal atoms, such as hydrogen, hydrocarbon groups, substituted hydrocarbon groups, and other groups of non-metallic atoms, as described herein above. In some embodiments, R$^1$, R$^2$, R$^3$, R$^4$, R$^5$, R$^{1'}$, R$^{2'}$, R$^{3'}$, R$^{4'}$ and R$^{5'}$ may be chosen independently from hydrogen, alkyl, aryl, alkenyl, alkynyl, trialkylsilyl or fluoroalkyl groups or other non-metal atoms or groups. In some embodiments, R$^1$, R$^2$, R$^3$, R$^4$, R$^5$, R$^{1'}$, R$^{2'}$, R$^{3'}$, R$^{4'}$ and R$^{5'}$ are each independently alkyl or fluoroalkyl or silylalkyl groups or alkylamide groups. In some embodiments, the R'' groups contain 1 to 4 carbon atoms.

A seed layer of Cu may be deposited conformally by methods such as CVD or ALD. ALD methods are described, for example, by Zhengwen Li, Antti Rahtu and Roy G. Gordon in the Journal of the Electrochemical Society, volume 153, pages C787-C794 (2006) and by Zhengwen Li and Roy G. Gordon in the journal Chemical Vapor Deposition, volume 12, pages 435-441 (2006). CVD methods are described in the paper by Hoon Kim, Harish B. Bhandari, Sheng Xu and Roy G. Gordon, which was published in the Journal of the Electrochemical Society, volume 155, issue 7, pages H496-H503 (2008). In this reference, smooth thin layers of copper oxynitride or copper oxide are first deposited using conventional vapor deposition techniques and then the deposited layers are reduced to smooth copper films by reduction with a hydrogen plasma at room temperature. Another method for reducing copper oxide films to copper metal is by reaction with liquid solutions of reducing agents such as dimethylamineborane or metal borohydrides.

Once a thin, conformal seed layer of copper has been made by one of these methods, electrochemical deposition can be used to fill the trenches and vias with copper by techniques known in the art. Electrochemical deposition has the advantages that it can provide pure copper without voids or seams in a cost-effective process.

In the foregoing description, the present invention has been described with respect to Mn metals. However, the present invention encompasses vanadium and chromium metals as well and these metals can be interchanged with manganese for the descriptions provided herein. For example, the precursor described above can be a chromium or vanadium amidinate having the structure, [Cr(AMD)$_m$]$_n$ or [Cr(AMD)$_m$]$_n$, where AMD is an amidinate and m=2 or 3 and n can range from 1 to 3.

EXAMPLE 1

The compound that served as a precursor for the manganese is called bis(N,N'-diisopropylpropionamidinato)manganese(II), whose chemical formula is shown below

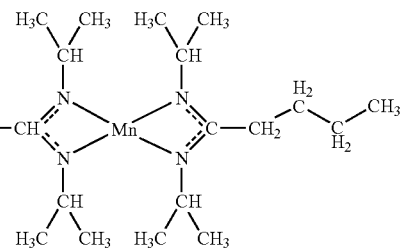

This compound was synthesized by the following method. All reactions and manipulations were conducted under a pure dinitrogen atmosphere using either an inert atmosphere box or standard Schlenk techniques. All glassware was stored in an oven at 150° C. for over 12 h before carrying reactions. Diethyl ether was purified using an Innovative Technology solvent purification system, and was freshly used from the purification without any storage. Butyllithium (1.6 M in hexanes), N,N'-diisopropylcarbodiimide, and manganese(II) chloride (anhydrous beads) were purchased from Aldrich and used as received. Volume reduction and evaporation steps were performed in vacuo.

Bis(N,N'-diisopropylpropionamidinato)manganese(II). At −30° C., a solution of butyllithium (1.6 M in hexanes, 100 mL, 160 mmol) was added dropwise to a well-stirred solution of N,N'-diisopropylcarbodiimide (20.2 g, 160 mmol) in 250 mL of diethyl ether. The pale-yellowish mixture was maintained at −30° C. for 4 h before being allowed to warm to ambient temperature. Manganese chloride (10.0 g, 79.5 mmol) was added as a solid to the solution, and the reaction mixture was stirred until all pinkish manganese chloride beads were reacted (ca. 48 h). The resulting cloudy orange mixture was filtered through a pad of Celite on a glass frit to yield a clear orange-brown solution. All volatiles were removed, leaving a yellow-brown solid that was vacuum distilled at 120° C. at 20 mTorr into a condenser and receiving flask heated to over 60° C., the melting point of the product. The pale yellowish liquid condensate solidified in the receiving flask as it cooled to room temperature, giving 27.4 g, 65 mmol, or 82% yield of pure product. Bis(N,N'-diisopropylpropionamidinato)manganese(II) is a pale yellow crystalline solid that immediately turns black when exposed to air.

For the CVD experiments, the liquid manganese precursor was evaporated at a temperature of 90° C. into a flow of highly purified nitrogen (concentrations of water and oxygen less than $10^{-9}$ of the $N_2$). The vapor pressure of the precursor is estimated to be around 0.1 mbar at this temperature.

The silica substrates were either thermally oxidized silicon or silica deposited ALD or by plasma-enhanced CVD. The CVD was carried out in a hot-wall tube reactor (diameter 36 mm) within a tube furnace at temperatures between 200 and 400° C. and a total pressure of about 5 Torr. The flow rate of $N_2$ carrier gas was 60 sccm. The amount of manganese deposited was measured by Rutherford backscattering spectroscopy (RBS).

The $MnSi_xO_y$ formation was evaluated by cross-sectional high-resolution transmission electron microscopy (HRTEM). The effectiveness of the $MnSi_xO_y$ as a barrier to diffusion of Cu was tested in four ways: optical appearance, sheet resistance, Cu silicide formation and capacitance-voltage (CV) analysis of capacitors. For Cu diffusion tests, layers of $SiO_2$ 8 nm thick were grown on HF-etched silicon wafers by ALD at 215° C., followed by CVD Mn at 350° C. for 10 min, which deposited an amount of Mn metal equivalent to a Mn metal film 2.3 nm thick, which reacted with the silica surface to form a thicker $MnSi_xO_y$ layer. Control samples of $SiO_2$ omitted the CVD Mn treatment. Then Cu layers about 200 nm thick were deposited on top of the CVD $MnSi_xO_y$ or $SiO_2$ layers. Anneals in a pure nitrogen atmosphere were carried out at temperatures of 400, 450 and 500° C. for one hour. For CV analysis, CVD Mn was deposited on 300 nm thermal $SiO_2$. Cu pads (500 µm diameter circle) were formed by thermal evaporation through a shadow mask.

Figure 11:
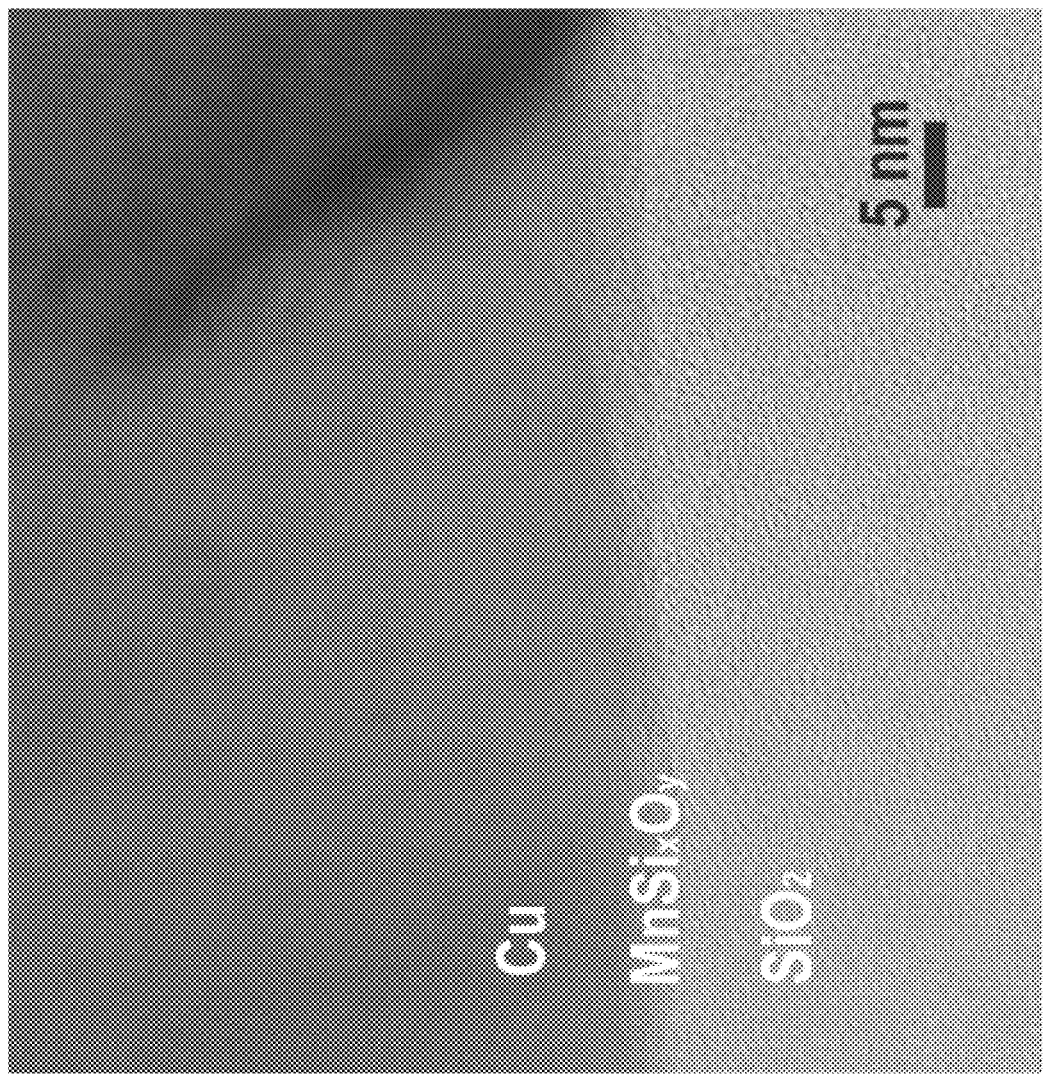
FIG. 11 is a cross-sectional high-resolution transmission micrograph of the result of CVD Mn on a $Cu/SiO_2/Si$ substrate.

Thin Mn layers (equivalent to a Mn metal layer 2.3 nm thick) deposited on $SiO_2$ did not have significant electrical conductivity, presumably because the Mn reacts with the insulator to form $MnSi_xO_y$ which has a high resistivity. Thus, the deposition of metal Mn is not proven by this result. To confirm that Mn metal was initially deposited, Mn was deposited on Cu 50 nm thick that had been evaporated onto $SiO_2$/Si substrates. The resulting structure was examined by cross-sectional HRTEM. FIG. 11 shows that the CVD Mn metal diffused through the Cu layer and reacted with the $SiO_2$ to form an amorphous $MnSi_xO_y$ layer about 2-5 nm thick between the Cu and the $SiO_2$. The $MnSi_xO_y$ layer is thicker near grain boundaries in the Cu, along which Mn diffusion is faster. This result is clear evidence of Mn metal deposition.

These layers show strong adhesion after Mn deposition. No material was removed after a tape adhesion test. The adhesion of these layers was measured more quantitatively by a 4-point bend test to be greater than 5 J m$^{-2}$. This value is high enough to survive CMP and later mechanical stresses in microelectronic devices. In control experiments, Cu deposited on $SiO_2$ without the subsequent Mn deposition was easily pulled off by tape because of its poor adhesion.

The effectiveness of $MnSi_xO_y$ as a copper barrier was evaluated using a sample structure PVD Cu(200 nm)/CVD Mn (2.3 nm)/ALD $SiO_2$ (8 nm)/Si. A $MnSi_xO_y$ layer was formed between the Cu and ALD $SiO_2$ layers. The shiny Cu color and sheet resistances of these samples were unchanged by anneals in nitrogen at 400 or 450° C. After a 500° C. anneal, the control sample without Mn turned black and its sheet resistance increased by a factor of 200 because of massive diffusion of the Cu through the thin ALD $SiO_2$ into the silicon. The CVD Mn sample, by contrast, retained its shiny Cu color and showed only a slight increase in resistance even at 500° C.

Figure 12:
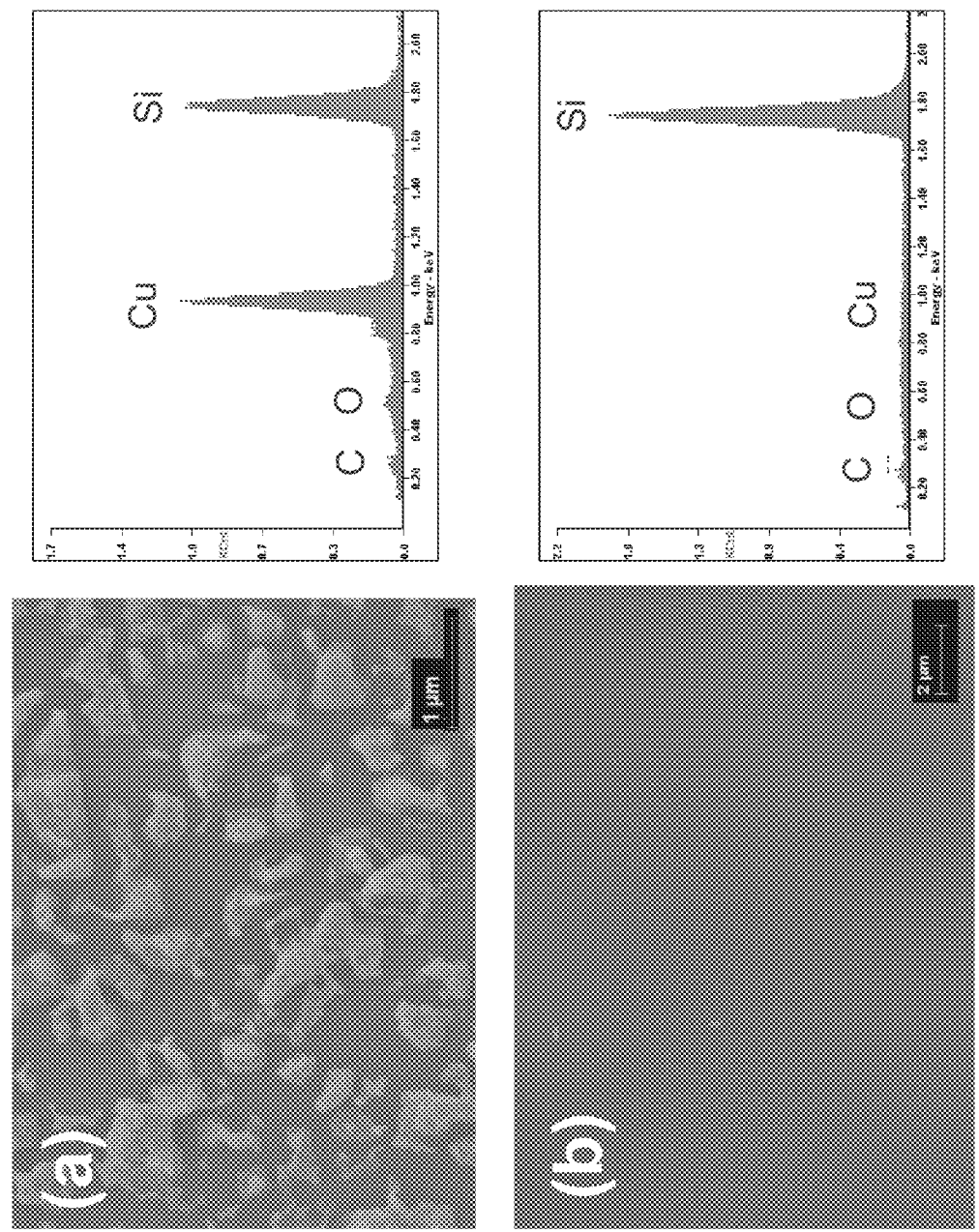
FIG. 12 is a scanning electron micrograph of (a) $Cu/SiO_2/Si$ and (b) $Cu/MnSi_xO_y/Si$ after annealing at 500° C. and etching off the Cu, along with elemental analyses of the surfaces.

To analyze for Cu diffusion, the remaining Cu layers were dissolved in nitric acid, and then the manganese silicate and silica were removed by dilute HF. The etched surfaces were then analyzed by an energy-dispersive X-ray spectrometer (EDX) and scanning electron micrographs (SEM). FIG. 12 shows the SEM results after a 500° C. anneal for 1 hr. The few Cu-containing spots appear to be Cu silicide crystallites oriented by the crystal directions of the silicon. The control sample shows that the majority of its surface is covered by Cu silicide. The control sample showed a large Cu signal in EDX analysis that was stronger than the silicon signal, confirming that the thin ALD $SiO_2$ allowed diffusion of Cu. The CVD Mn-treated samples did not show Cu by large-area EDAX. A few small areas of the SEM image did show some Cu by EDAX, indicating some localized breakdown of the $MnSi_xO_y$ barrier at 500° C. These spots might arise from dust or other defects in the films, which were not processed in a clean-room environment.

Figure 13:
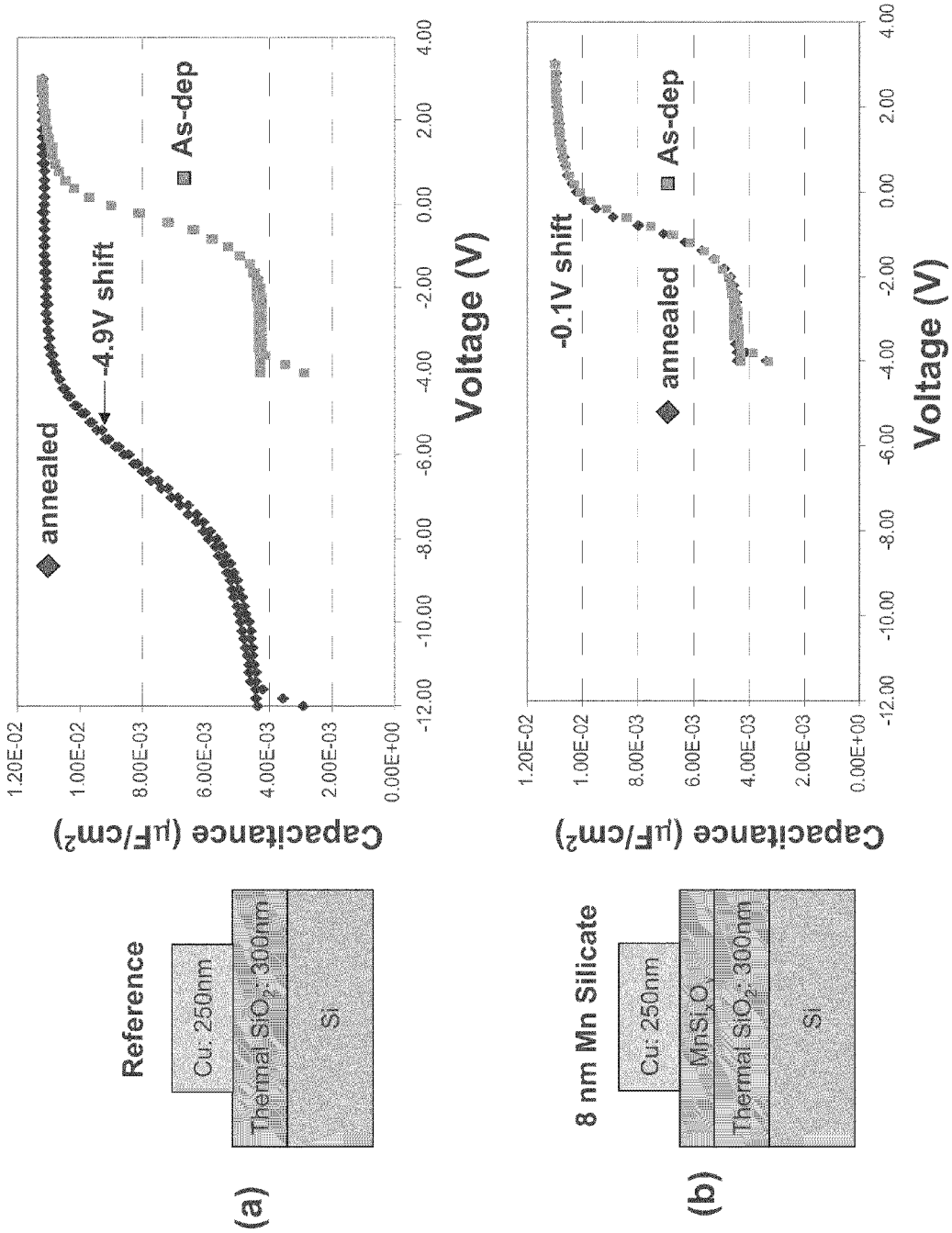
FIG. 13 shows capacitance-voltage curves for samples of (a) $Cu/SiO_2/Si$ and (b) $Cu/MnSi_xO_y/SiO_2/Si$ before and after annealing at 400° C.

An electrical test of barrier properties was carried out by patterning the Cu into capacitor electrodes. CV curves for samples annealed at 450° C. for 1 hr are shown in FIG. 13. The large shift (−4.9 V) to negative voltages in the control sample is caused by positive Cu ions diffusing into the silica insulator. In contrast, the silica protected by $MnSi_xO_y$ shows only a very small shift (−0.1 V). This electrical test is more sensitive to diffusion of small amounts of Cu than the other tests. These CV curves also demonstrate that the capacitance of the $SiO_2$ is not changed significantly by the CVD Mn treatment.

Anneals of similar capacitors were also conducted under an applied voltage of 1 MV/cm at 250° C. Bias temperature stress (BTS) test is more sensitive method for Cu diffusion into $SiO_2$. The control sample lost the capacitance behavior after just 2 minutes in the BTS condition (FIG. 14(a)), implying that a large amount of Cu diffused into the Si, so that the Si would not work as a semiconductor. However, the CVD Mn treated sample had no significant change in its CV curve (FIG. 14(b)). The results of this BTS test confirm the good Cu barrier properties of the $MnSi_xO_y$ layers.

$MnSi_xO_y$ layers were also found to be good barriers to oxygen and water, which can corrode copper layers. To test how well the metal silicate layers protected copper, commercial low-k porous insulator layers from Applied Materials was coated with manganese as described above, followed by CVD copper. The top surface of the copper was protected with 20 nm of ALD silica by the process described in Science, volume 298, pages 402-406 (2002). The sample was cut into pieces to expose the edges of the low-k insulator so that oxygen or water vapor could diffuse into the low-k layer. After exposure to dry air at 300° C. for 24 hours, the sample maintained its shiny copper color. A control sample without the CVD manganese treatment was corroded to dark copper oxide by the same exposure. This test shows that the manganese silicate layer is a good barriers to oxygen. Similar tests in a humid atmosphere (85% humidity at 85° C. for 24 hours) showed that the manganese silicate layer is a good barrier to water vapor.

The formation of the $MnSi_xO_y$ layer increased the adhesion of the Cu/$SiO_2$ interface, which failed the tape adhesion test prior to the CVD of Mn, but passed after the CVD of Mn. Adhesion strength was measured by 4-point bend tests. The samples were prepared by CVD of Mn onto thermal $SiO_2$ on silicon wafers. Then CVD at 200° C. was used to form Cu by the reaction of vapors of copper N,N'-di-sec-butylacetamidinate and hydrogen ($H_2$). The adhesion energy was found to be 10.1±1 J m$^{-2}$. Generally, 5 J m$^{-2}$ is considered to be a minimum threshold requirement for making durable interconnections.

Figure 15:
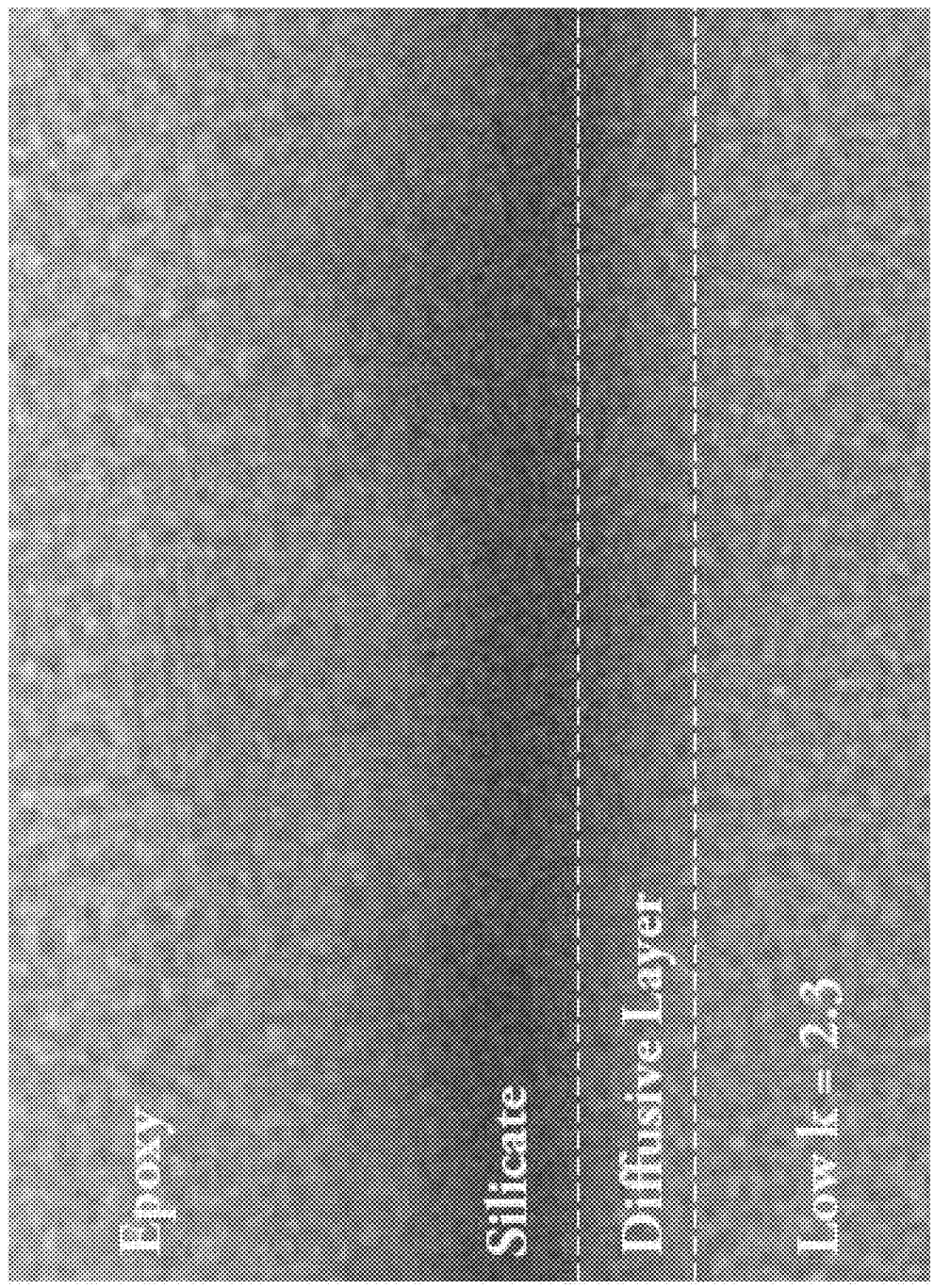
FIG. 15 shows a cross-section of a $MnSi_xO_y$ layer formed by CVD on a low-k insulator.

A cross-sectional transmission electron microscope (TEM) was used to make an image (FIG. 15) of a $MnSi_xO_y$ layer in the surface of a low-k insulator. This image shows the $MnSi_xO_y$ layer as a dark, featureless band, indicating that this layer is an amorphous glass. Conformality of the CVD Mn and CuON depositions in holes with aspect ratios up to 40:1 was confirmed by cross-sectional SEM and TEM studies.

EXAMPLE 2

Example 1 is repeated with manganese cyclopentadienyl tricarbonyl, $MnCp(CO)_3$, in place of bis(bis(N,N'-diisopropyl-pentylamidinato)manganese(II). Similar results are obtained.

EXAMPLE 3

Example 1 is repeated with chromium in place of manganese. Similar results are obtained.

EXAMPLE 4

Example 1 is repeated with vanadium in place of manganese. Similar results are obtained.

EXAMPLE 5

Improved adhesion between Mn-diffused Cu and an SiCN insulating film was obtained. Quantitative 4-point bend tests of the adhesion energy between Mn-diffused Cu and SiCN layers were carried out. 50 nm of copper was evaporated onto SiCN layers (BLoK™, Applied Materials). The Cu showed very poor adhesion, with adhesion energy less than 3 J m$^{-2}$. Next, similar Cu/SiCN layers were treated by CVD Mn at 350° C. for 10 minutes. This process increased the sheet resistance from 0.5 ohms/square to 1 ohm per square because of the manganese impurity in the copper. Then the structure was annealed for 1 hour at 400° C. in a nitrogen atmosphere. The sheet resistance then returned to slightly less than 0.5 ohms per square because the manganese diffused to the surfaces or the interface. The out-diffusion of the manganese from the Cu film was confirmed by SIMS analysis. After the heat treatment, the adhesion energy was remarkably increased to greater than 12 J m$^{-2}$, because manganese diffused to the interface, and made an interface or reaction layer. The adhesion energy was greater than the 10.1±1 J m$^{-2}$ obtained in Example 1.

EXAMPLE 6

Even greater adhesion between Mn-diffused Cu and $Si_3N_4$ layers were observed. 20 nm of Cu was deposited by CVD as in Example 1 on a silicon wafer that had been previously coated with $Si_3N_4$ by plasma-activated CVD. Then 2.3 nm of Mn was deposited by the CVD process described in Example 1. Next another 20 nm of Cu was deposited by CVD, followed by 30 nm of $Si_3N_4$ by plasma-activated CVD (PECVD). The adhesion of these layers was so strong that they could not be separated during the 4-point bend tests. Instead, the high-strength epoxy failed at debonding energy densities over 80 J m$^{-2}$. Accordingly, at least an 8-fold increase in adhesion was observed using $Si_3N_4$ layers rather than the silica layer of Example 1.

Control samples made without the CVD Mn step failed at much lower debonding energy densities of about 7 J m$^{-2}$.

These results show that the bonding of Cu to a capping layer of $Si_3N_4$ can be greatly strengthened by the addition of Mn to the Cu layer by CVD. The much stronger bonding of the Mn-doped Cu to the capping layer can suppress electromigration along the tops of the capped line. Thus this capping process leads to a much greater lifetime of the interconnect lines before they fail by electromigration. The interfacial bonding layer comprising Mn, Si and N bonds copper metal to $Si_3N_4$ more strongly than an interfacial layer that includes oxygen.

EXAMPLE 7

In addition, the Mn capping process is able to maintains the insulation between Cu lines. In order to demonstrate this effect, comb test structures were prepared with long (~4 cm) parallel Cu interconnects separated by $SiO_2$-based insulating lines 70 nm wide. The upper surfaces were prepared by chemical-mechanical polishing to be substantially flat. The leakage current between the lines was less than $10^{-12}$ amperes when measured at 2 volts. After CVD of Mn as in Example 1 for 5 minutes and PECVD of 20 nm $Si_3N_4$, the leakage current remained at this low base-line level. The resistance along the length of the lines decreased slightly from its initial value, possibly because of growth in the size of the copper grains during the CVD processes.

It is recognized, of course, that those skilled in the art may make various modifications and additions to the processes of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A process for forming an integrated circuit interconnect structure, said process comprising:
    a) providing a partially-completed interconnect structure comprising an electrically insulating region and an electrically conductive copper-containing region, said partially-completed interconnect structure having a substantially planar surface;
    b) depositing a metal (M) selected from the group consisting of manganese, chromium and vanadium on or into at least a portion of the electrically conductive copper-containing regions;
    c) depositing an insulating film on at least a part of the deposited metal, wherein the region of the deposited insulating film in contact with said at least a part of the deposited metal is substantially free of oxygen;
    d) reacting at least a part of the deposited metal with the insulating film to form a barrier layer, wherein the electrically conductive copper-containing region is substantially free of elemental metal (M).

2. The process of claim 1, further comprising performing lithography to form at least one via and/or trench in said insulating film.

3. The process of claim 2, further comprising depositing a second metal, which can be the same or different from the metal deposited and reacting at least a part of the deposited second metal with the insulating film to form a second barrier layer.

4. The process of claim 3, further comprising filling the at least one via and/or trench with copper.

5. The process of claim 4, further comprising polishing the copper to obtain a second partially-completed interconnect structure having a substantially planar surface, wherein said second partially-completed interconnect structure comprises an electrically insulating region and an electrically conductive copper-containing region.

6. The process of claim 5, wherein at least one of said depositing a metal, said depositing an insulating film, said reacting, said performing lithography, said filling, and said polishing is repeated.

7. The process of claim 1, wherein depositing a metal (M) is carried out using CVD or ALD.

8. The process of claim 1, wherein depositing a metal (M) is carried out using a physical deposition process.

9. The process of claim 1, further comprising diffusing said deposited metal into at least a part of the electrically conductive region to form a copper-metal alloy.

10. The process of claim 9, wherein said diffusing includes a thermal annealing process.

11. The process of claim 1, further comprising removing any metal deposited on or reacted with said electrically insulating region before said depositing an insulating film.

12. The process of claim 11, wherein said removing is carried out using polishing.

13. The process of claim 11, wherein said removing is carried out using chemical etching.

14. The process of claim 1, wherein said deposited insulating film comprises silicon and nitrogen.

15. The process of claim 1, wherein said reacting includes a thermal annealing process.

16. The process of claim 1, wherein the metal is manganese.

17. The process of claim 1, wherein the metal is deposited using a metal amidinate having the formula, $[M(AMD)_m]_n$, where AMD is an amidinate, m=2 or 3, and n ranges from 1 to 3.

18. The process of claim 17, wherein the metal amidinate has the structure

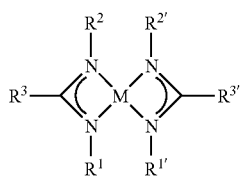

wherein $R^1$, $R^2$, $R^3$, $R^{1'}$, $R^{2'}$ and $R^{3'}$ are chosen independently from hydrogen, alkyl, aryl, alkenyl, alkynyl, trialkylsilyl or fluoroalkyl groups or other non-metal atoms or groups.

19. The process of claim 18, wherein $R^1$, $R^2$, $R^3$, $R^{1''}$, $R^{2'}$ and $R^{3'}$ are each independently alkyl or fluoroalkyl or silylalkyl groups or alkylamide groups.

20. The process of claim 18, wherein the metal amidinate comprises manganese(II) bis(N,N'-diisopropylpentylamidinate), where $R^1$, $R^2$, $R^{1'}$ and $R^{2'}$ are isopropyl groups, and $R^3$ and $R^{3'}$ are n-butyl groups.

21. The process of claim 1, wherein the metal is deposited using a metal cyclopentadienyl carbonyl having the formula $(Cp)_q M_r (CO)_s$, where Cp is an cyclopentadienyl radical substituted by up to five groups, and q, r and s are positive integers.

22. The process of claim 21, wherein the metal cyclopentadienyl carbonyl has the structure

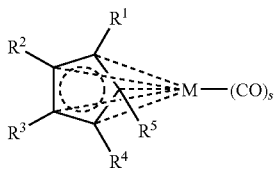

wherein the $R^1$, $R^2$, $R^3$, $R^4$, and $R^5$ groups are chosen independently from hydrogen, alkyl, aryl, alkenyl, alkynyl, trialkylsilyl or fluoroalkyl groups or other non-metal atoms or groups.

23. The process of claim 22, wherein $R^1$, $R^2$, $R^3$, $R^4$ and $R^5$ are each independently alkyl or fluoroalkyl or silylalkyl groups or alkylamide groups.

24. The process of claim 21, wherein the metal cyclopentadienyl carbonyl comprises methylcyclopentadienylmanganese tricarbonyl, $(MeCp)Mn(CO)_3$.

25. The process of claim 1, wherein the metal is deposited using a metal cyclopentadienyl having the formula, $M(Cp)_2$, where Cp is a cyclopentadienyl radical substituted by up to five groups.

26. The process of claim 25, wherein the metal cyclopentadienyl has the structure

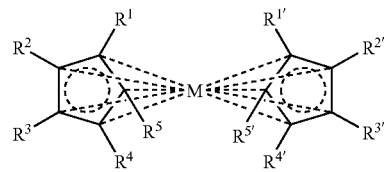

where $R^1$, $R^2$, $R^3$, $R^4$, $R^5$, $R^{1'}$, $R^{2'}$, $R^{3'}$, $R^{4'}$ and $R^{5'}$ are chosen independently from hydrogen, alkyl, aryl, alkenyl, alkynyl, trialkylsilyl or fluoroalkyl groups or other non-metal atoms or groups.

27. The process of claim 26, wherein $R^1$, $R^2$, $R^3$, $R^4$, $R^5$, $R^{1'}$, $R^{2'}$, $R^{3'}$, $R^{4'}$ and $R^{5'}$ are each independently alkyl or fluoroalkyl or silylalkyl groups or alkylamide groups.

28. The process of claim 1, wherein said insulating film comprises at least one insulating sub-layers.

29. The process of claim 28, wherein said sub-layers include an adhesion enhancing sub-layer, an etch-stop sub-layer, a porous dielectric sub-layer, and a denser dielectric sub-layer.

30. The process of claim 29, wherein said adhesion enhancing sub-layer is silicon nitride, said etch-stop sub-layer is silicon carbide, said porous dielectric sub-layer has a dielectric constant under 2.5, and said denser dielectric sub-layer has a dielectric constant over 2.5.

31. A process for forming an integrated circuit interconnect structure, said process comprising:
  a) providing a partially-completed interconnect structure having a via or a trench, said via or said trench comprising sidewalls defined by one or more electrically insulating materials and an electrically conductive copper-containing bottom region;
  b) depositing a metal (M) selected from the group consisting of manganese, chromium and vanadium on the partially-completed interconnect structure;
  c) forming second insulating sidewall regions through reaction of the deposited metal and said one or more electrically insulating materials;
  d) removing or diffusing away the metal from the bottom region to expose said electrically conductive copper-containing bottom region; and
  e) filling said via or said trench with copper.

32. The process of claim 31, further comprising:
  f) removing any excess copper filled into said via or said trench to obtain a second partially-completed interconnect structure having a substantially planar surface, said second partially-completed interconnect structure comprising an electrically insulating region and an electrically conductive copper-containing region.

33. The process of claim 32, further comprising:
g) depositing a second metal (M) selected from the group consisting of manganese, chromium and vanadium on or into at least a portion of the electrically conductive copper-containing regions;
h) depositing an insulating film on at least a part of the deposited second metal, wherein region of the insulating film in contact with said at least a part of the deposited second metal is substantially free of oxygen;
i) reacting at least a part of the deposited second metal with the insulating film to form a barrier layer, wherein the electrically conductive copper-containing region is substantially free of elemental metal (M).

34. The process of claim 33, further comprising:
j) performing lithography to form a via or a trench in said insulating film to obtain a partially-completed interconnect structure having a via or a trench.

35. The process of claim 34, further comprising: repeating at least one of said depositing a metal, said forming a second insulating sidewall, said removing or diffusing away, said filling, said depositing a second metal, said depositing an insulating film, said reacting, and said performing lithography.

36. The process of claim 31, wherein said depositing a metal (M) is carried out using CVD or ALD.

37. The process of claim 31, wherein said depositing a metal (M) is carried out using a physical deposition process.

38. The process of claim 33, further comprising diffusing said deposited second metal into at least a part of the electrically conductive region to form a copper-metal alloy.

39. The process of claim 38, wherein said diffusing includes a thermal annealing process.

40. The process of claim 31, further comprising removing any second metal deposited on or reacted with said electrically insulating region before said depositing an insulating film.

41. The process of claim 40, wherein said removing is carried out using polishing.

42. The process of claim 40, wherein said removing is carried out using chemical etching.

43. The process of claim 31, wherein the electrically insulating materials comprise silicon and oxygen.

44. The process of claim 31, wherein the electrically insulating materials comprise silicon and nitrogen.

45. The process of claim 33, wherein said reacting includes a thermal annealing process.

46. The process of claim 31, wherein the metal is manganese.

47. The process of claim 31, wherein the metal is deposited using a metal amidinate having the structure, $[M(AMD)_m]_n$, where AMD is an amidinate, m=2 or 3, and n range from 1 to 3.

48. The process of claim 47, wherein the metal amidinate has the structure

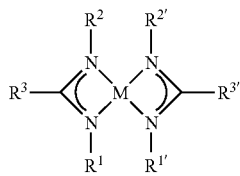

wherein $R^1$, $R^2$, $R^3$, $R^{1'}$, $R^{2'}$ and $R^{3'}$ are chosen independently from hydrogen, alkyl, aryl, alkenyl, alkynyl, trialkylsilyl or fluoroalkyl groups or other non-metal atoms or groups.

49. The process of claim 48, wherein $R^1$, $R^2$, $R^3$, $R^{1''}$, $R^{2'}$ and $R^{3'}$ are each independently alkyl or fluoroalkyl or silylalkyl groups or alkylamide groups.

50. The process of claim 48, wherein the metal amidinate comprises manganese(II) bis(N,N'-diisopropylpentylamidinate), where $R^1$, $R^2$, $R^{1'}$ and $R^{2'}$ are isopropyl groups, and $R^3$ and $R^{3'}$ are n-butyl groups.

51. The process of claim 31, wherein the metal is deposited using a metal cyclopentadienyl carbonyl having the structure $(Cp)_qM_r(CO)_s$, where Cp is an cyclopentadienyl radical substituted by up to five groups, and q, r and s are positive integers.

52. The process of claim 51, wherein the metal cyclopentadienyl carbonyl has the structure

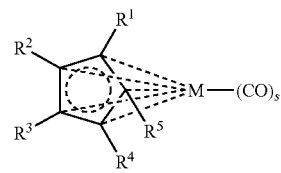

wherein the $R^1$, $R^2$, $R^3$, $R^4$, and $R^5$ groups are chosen independently from hydrogen, alkyl, aryl, alkenyl, alkynyl, trialkylsilyl or fluoroalkyl groups or other non-metal atoms or groups.

53. The process of claim 52, wherein $R^1$, $R^2$, $R^3$, $R^4$ and $R^5$ are each independently alkyl or fluoroalkyl or silylalkyl groups or alkylamide groups.

54. The process of claim 53, wherein the metal cyclopentadienyl carbonyl comprises methylcyclopentadienylmanganese tricarbonyl, $(MeCp)Mn(CO)_3$.

55. The process of claim 31, wherein the metal is deposited using a metal cyclopentadienyl having the structure, $M(Cp)_2$, where Cp is a cyclopentadienyl radical substituted by up to five groups.

56. The process of claim 55, wherein the metal cyclopentadienyl has the structure

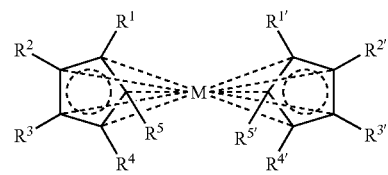

wherein $R^1$, $R^2$, $R^3$, $R^4$, $R^5$, $R^{1'}$, $R^{2''}$, $R^{3'}$, $R^{4'}$ and $R^{5'}$ are chosen independently from hydrogen, alkyl, aryl, alkenyl, alkynyl, trialkylsilyl or fluoroalkyl groups or other non-metal atoms or groups.

57. The process of claim 56, wherein $R^1$, $R^2$, $R^3$, $R^4$, $R^5$, $R^{1'}$, $R^{2'}$, $R^{3'}$, $R^{4'}$ and $R^{5'}$ are each independently alkyl or fluoroalkyl or silylalkyl groups or alkylamide groups.

58. The process of claim 33, wherein said insulating film comprises at least one insulating sub-layers.

59. The process of claim 58, wherein said sub-layers include an adhesion enhancing sub-layer, an etch-stop sub-layer, a porous dielectric sub-layer, and a denser dielectric sub-layer.

60. The process of claim 59, wherein said adhesion enhancing sub-layer is silicon nitride, said etch-stop sub-layer is silicon carbide, said porous dielectric sub-layer has a dielectric constant under 2.5, and said denser dielectric sub-layer has a dielectric constant over 2.5.

* * * * *